(12) United States Patent
Knaack et al.

(10) Patent No.: US 6,173,425 B1
(45) Date of Patent: Jan. 9, 2001

(54) METHODS OF TESTING INTEGRATED CIRCUITS TO INCLUDE DATA TRAVERSAL PATH IDENTIFICATION INFORMATION AND RELATED STATUS INFORMATION IN TEST DATA STREAMS

(75) Inventors: Roland T. Knaack, Suwanee; Bruce Lorenz Chin, Duluth, both of GA (US)

(73) Assignee: Integrated Device Technology, Inc., Santa Clara, CA (US)

(*) Notice: Under 35 U.S.C. 154(b), the term of this patent shall be extended for 0 days.

(21) Appl. No.: 09/060,478

(22) Filed: Apr. 15, 1998

(51) Int. Cl.[7] .................................................. G11C 29/00
(52) U.S. Cl. ........................... 714/718; 714/738; 714/735
(58) Field of Search .................................. 371/27.1, 21.1; 714/718, 738, 735; 360/26; 365/189

(56) References Cited

U.S. PATENT DOCUMENTS

| Re. 35,645 | 10/1997 | Tobita ................................... 714/718 |
| 4,195,340 | * 3/1980 | Joyce .................................... 711/133 |
| 4,359,771 | 11/1982 | Johnson et al. ........................... 714/6 |
| 4,404,519 | 9/1983 | Westcott ................................. 714/736 |
| 4,481,627 | 11/1984 | Beauchesne et al. ................. 714/718 |
| 4,912,395 | 3/1990 | Sato et al. ............................ 714/719 |
| 4,969,148 | 11/1990 | Nadeau-Dostie et al. ........... 714/718 |
| 4,982,380 | 1/1991 | Koike ................................... 365/201 |
| 5,138,619 | 8/1992 | Fasang et al. . |
| 5,226,149 | 7/1993 | Yoshida et al. ......................... 714/25 |
| 5,301,156 | 4/1994 | Talley ................................... 365/201 |
| 5,325,367 | 6/1994 | Dekker et al. . |
| 5,331,643 | 7/1994 | Smith ................................... 714/728 |
| 5,371,708 | * 12/1994 | Kobayashi ............................ 365/221 |
| 5,377,148 | 12/1994 | Rajsuman .............................. 365/201 |
| 5,523,977 | 6/1996 | Tobita et al. .......................... 365/201 |
| 5,546,347 | 8/1996 | Ko et al. ............................... 365/221 |
| 5,561,781 | 10/1996 | Braceras et al. ...................... 395/458 |
| 5,586,299 | 12/1996 | Wakerly ................................ 395/476 |
| 5,598,421 | 1/1997 | Tran et al. ............................ 714/726 |
| 5,617,531 | 4/1997 | Crouch et al. .......................... 714/30 |
| 5,625,597 | 4/1997 | Hirose .................................. 365/201 |
| 5,642,318 | 6/1997 | Knaack et al. ........................ 365/201 |
| 5,671,393 | 9/1997 | Yamaki et al. ........................ 395/477 |
| 5,682,356 | 10/1997 | Knaack ................................. 365/236 |
| 5,712,820 | 1/1998 | Knaack ............................ 365/189.02 |
| 5,715,197 | 2/1998 | Nance et al. ..................... 365/189.02 |
| 5,732,041 | 3/1998 | Joffe ................................ 365/230.05 |

(List continued on next page.)

*Primary Examiner*—Emmanuel L. Moise
*Assistant Examiner*—Guy Lamarre
(74) *Attorney, Agent, or Firm*—Myers Bigel Sibley & Sajovec

(57) ABSTRACT

Methods of testing integrated circuits to include data traversal path identification information include the steps of transferring test data into an integrated circuit containing devices therein and then controlling operation of the integrated circuit so that the test data traverses a first path through the devices. At least a portion of the test data and an identification of at least a first portion of the first path are then retrieved from the integrated circuit. This retrieving step may be preceded by the step of overwriting a first portion of the test data with an identification of a first portion of the first path. In the case of a buffer memory device, an identification (e.g., address) of a current write register (receiving test data) may be "tagged" to a series of test words written into the current write register during test mode operation. Similarly, when the test data is ultimately read from the buffer memory device, an identification of a current read register may be "tagged" to the series of test words being read from the current read register. The tagged identification may be interleaved into the stream of test data being read from the current read register, may be overwritten into the stream or the address may be separately stored in the device and then provided (along with other path identification and status information) as a serial or parallel stream of identification data from a dedicated test I/O pad.

43 Claims, 11 Drawing Sheets

U.S. PATENT DOCUMENTS

| | | | |
|---|---|---|---|
| 5,740,119 | 4/1998 | Asakura et al. | 365/222 |
| 5,751,638 | 5/1998 | Mick et al. | 365/189.04 |
| 5,764,967 | 6/1998 | Knaack | 713/500 |
| 5,771,242 | 6/1998 | Adams et al. . | |
| 5,777,944 | 7/1998 | Knaack et al. | 365/230.06 |
| 5,781,721 | 7/1998 | Hayes et al. | 395/183.18 |
| 5,784,382 * | 7/1998 | Byers | 714/726 |
| 5,790,468 | 8/1998 | Oh | 365/222 |
| 5,790,564 | 8/1998 | Adams et al. . | |
| 5,793,685 | 8/1998 | Suma | 365/201 |
| 5,801,986 | 9/1998 | Matsumoto et al. | 365/185.09 |
| 5,825,782 | 10/1998 | Roohparvar . | |
| 5,829,015 | 10/1998 | Maeno | 711/104 |
| 5,835,504 | 11/1998 | Balkin et al. . | |
| 5,867,439 | 2/1999 | Asakura et al. | 365/222 |
| 5,914,968 | 6/1999 | Keeth . | |
| 5,936,975 | 8/1999 | Okamura . | |
| 5,940,874 | 8/1999 | Fulcomer | 711/217 |
| 5,946,246 | 8/1999 | Jun et al. | 365/201 |
| 5,959,911 | 9/1999 | Krause et al. | 365/201 |
| 5,966,388 | 10/1999 | Wright et al. | 714/719 |
| 5,968,190 | 10/1999 | Knaack | 714/719 |
| 6,005,814 | 12/1999 | Mulholland et al. | 365/201 |
| 6,023,777 | 2/2000 | Knaack | 714/418 |

* cited by examiner

METHODS OF TESTING INTEGRATED CIRCUITS TO INCLUDE DATA TRAVERSAL PATH IDENTIFICATION INFORMATION AND RELATED STATUS INFORMATION IN TEST DATA STREAMS

FIELD OF THE INVENTION

The present invention relates to integrated circuits and methods of operating and testing same, and more particularly to sequential memory devices and methods of operating and testing sequential memory devices.

BACKGROUND OF THE INVENTION

Semiconductor memory devices can typically be classified on the basis of memory functionality, data access patterns and the nature of the data storage mechanism. For example, distinctions are typically made between read-only memory (ROM) devices and read-write memory (RWM) devices. The RWM devices typically have the advantage of offering both read and write functionality with comparable data access times. Typically, in RWM devices, data is stored either in flip-flops for "static" memory devices or as preset levels of charge on a capacitor in "dynamic" memory devices. As will be understood by those skilled in the art, static memory devices retain their data as long as a supply of power is maintained, however, dynamic memory devices require periodic data refreshing to compensate for potential charge leakage. Because RWM devices use active circuitry to store data, they belong to a class of memory devices known as "volatile" memory devices because data stored therein will be lost upon termination of the power supply. ROM devices, on the other hand, may encode data into circuit topology (e.g., by blowing fuses, removing diodes, etc.). Since this latter type of data storage may be hardwired, the data cannot be modified, but can only be read. ROM devices also typically belong to a class of memory devices known as "nonvolatile" memory devices because data stored therein will typically not be lost upon termination of the power supply. Other types of memory devices that have been more recently developed are typically referred to as nonvolatile read-write (NVRWM) memory devices. These types of memory devices include EPROM (erasable programmable read-only memory), $E^2$PROM (electrically erasable programmable read-only memory), and flash memories, for example.

An additional memory classification is typically based on the order in which data can be accessed. Here, most memory devices belong to the random-access class, which means that memory locations can be read from or written to in random order. Notwithstanding the fact that most memory devices provide random-access, typically only random-access RWM memories use the acronym RAM. Alternatively, memory devices may restrict the order of data access to achieve shorter data access times, reduce layout area and/or provide specialized functionality. Examples of such specialized memory devices include buffer memory devices such as first-in first-out (FIFO) memory devices, last-in first-out (LIFO or "stack") memory devices, shift registers and content-addressable memory (CAM) devices.

A final classification of semiconductor memories is based on the number of data input and data output ports associated with the memory cells therein. For example, although most memory devices have unit cells therein that provide only a single port which is shared to provide an input and output path for transfer of data, memory devices with higher bandwidth requirements often have cells therein with multiple input and output ports. However, the addition of ports to unit memory cells typically increases the complexity and layout area requirements for these higher bandwidth memory devices.

Single-port memory devices are typically made using static RAM cells if fast data access times are a requirement, and dynamic RAM cells if low cost is a primary requirement. Many FIFO memory devices use dual-port RAM based designs with self-incrementing internal read and write pointers to achieve fast fall-through capability. As will be understood by those skilled in the art, fall-through capability is typically measured as the time elapsing between the end of a write cycle into a previously empty FIFO and the time an operation to read that data may begin. Exemplary FIFO memory devices are more fully described and illustrated at section 2.2.7 of a textbook by A. K. Sharma entitled "Semiconductor Memories: Technology, Testing and Reliability", IEEE Press (1997).

In particular, dual-port SRAM-based FIFOs typically utilize separate read and write pointers to advantageously allow read and write operations to occur independently of each other and achieve fast fall-through capability since data written into a dual-port SRAM FIFO can be immediately accessed for reading. Since these read and write operations may occur independently, independent read and write clocks having different frequencies may be provided to enable the FIFO to act as a buffer between peripheral devices operating at different rates. Unfortunately, a major disadvantage of typical dual-port SRAM4-based FIFOs is the relatively large unit cell size for each dual-port SRAM cell therein. Thus, for a given semiconductor chip size, dual-port buffer memory devices typically provide less memory capacity relative to single-port buffer memory devices. For example, using a standard DRAM cell as a reference unit cell consuming one (1) unit of area, a single-port SRAM unit cell typically may consume four (4) units of area and a dual-port SRAM unit cell typically may consume sixteen (16) units of area. Moreover, the relatively large unit cells of a dual-port SRAM FIFO limit the degree to which the number of write operations can exceed the number of read operations, that is, limit the capacity of the FIFO.

To address these limitations of dual-port buffer memory devices, single-port buffer memory devices have been developed to, among other things, achieve higher data capacities for a given semiconductor chip size. For example, U.S. Pat. No. 5,546,347 to Ko et al. entitled "Interleaving Architecture And Method For A High Density FIFO", assigned to the present assignee, discloses a preferred memory device which has high capacity and uses relatively small single-port memory cells. However, the use of only single port memory cells typically precludes simultaneous read and write access to data in the same memory cell which means that single-port buffer memory devices typically have slower fall-through time than comparable dual-port memory devices. Moreover, single-port buffer memory devices may use complicated arbitration hardware to control sequencing and queuing of reading and writing operations.

U.S. Pat. No. 5,371,708 to Kobayashi also discloses a FIFO memory device containing an embedded single-port memory array, a read data register for holding read data from the memory array and a write data register for holding write data to the memory array. A bypass switch is also provided for transferring data from the write data register directly to the read data register so that the embedded memory array can be bypassed during testing of the FIFO to detect the presence of detects therein. However, like the above-described single-port buffer memory devices, simultaneous read and write access to data is not feasible.

Other attempts have also been made to develop high performance memory devices and techniques to test memory devices which may be embedded in an integrated circuit. For example, U.S. Pat. No. 4,404,519 to Westcott, entitled *Testing Embedded Arrays in Large Scale Integrated Circuits*, discloses an integrated circuit chip having an embedded array which is not directly accessible from the primary input/output pins. In particular, the disclosed integrated circuit is manufactured with additional test circuitry directly on the chip so that the performance of the array may be tested from the input/output pins by an external chip tester while the array remains embedded.

U.S. Pat. No. 4,481,627 to Beauchesne et al., entitled *Embedded Memory Testing Method and Apparatus*, discloses a method for testing memory arrays embedded within electronic assemblies having other combinational logic elements connected to the inputs thereof. The embedded memory can be isolated from the combinational logic elements and tested by use of a memory test subsystem. U.S. Pat. No. 4,969,148 to Nadeau-Dostie et al., entitled *Serial Testing Technique for Embedded Memories*, discloses a testing circuit which interfaces serially with the data path of an embedded memory circuit from at least one memory unit having separated data input and output lines and tandem addressing. Part of the testing circuit includes a series of two-input multiplexer units which are adapted to be embedded on the same chip as the memory circuit. The outputs of the multiplexer units connect to a respective one of the data input lines of the memory circuit. With the exception of the first bit position, a first input of each multiplexer unit is adapted to connect to the data output line of the adjacent bit position in the memory circuit. The second inputs of the multiplexer units are adapted to connect to the data bus of the chip. A finite state machine is also provided. This finite state machine is adapted to connect to the first input of the multiplexer unit at the first bit position and to the data output line at the least bit position. During testing, the finite state machine actuates the multiplexer units to connect the first bits, and for each address outputs a series of test bits, shifts those bits through the addressed word by a series of read and write operations, and examines those bits after their passage through the addressed word for defects in the memory circuit at that address. The finite state machine may or may not be embedded on the same chip as the memory circuit.

U.S. Pat. No. 5,331,643 to Smith, entitled *Self-Testing Logic with Embedded Arrays*, discloses shift register latch scan strings employed in a level sensitive scan design methodology for built-in circuit self-test. The scan strings are provided with bypassable portions which are made to serve as address registers for arrays which are embedded in blocks of logic for which the scan strings are meant to provide pseudo-random excitation test data. The bypassable portion of the scan strings is connected to an address stepper mechanism which insures complete coverage throughout the range of cell addresses within the array. This is accomplished through the utilization of a stepping counter or the utilization of a linear feedback shift register or similar mechanism so that every cell address in the array is provided with known pseudo-random data at the beginning of a test and which is also capable of providing array cell content information at the end of the test and/or at various times during test. In addition, U.S. Pat. No. 5,617,531 to Crouch et al., entitled Data Processor Having a Built-In Internal Self Test Controller for Testing a Plurality of Memories Internal to the Data Processor, discloses a data processor having a single test controller which includes a test pattern generator and a memory verification element. The test pattern generator generates and communicates a plurality of test patterns to the plurality of memories through a second storage device. A first storage device is used to store data read from the plurality of memories. The data from the first storage device is selectively accessed by the memory verification element via the bus. A bit or more than one bit is used to communicate whether the memories are operating in an error free manner.

Notwithstanding these attempts to provide techniques for testing memory devices containing embedded memory arrays, there still exists a need to develop improved techniques for operating and testing integrated circuits, such as memory devices having embedded memory arrays therein. There also exists a need to develop memory devices having increased functionality, increased data capacity and reduced unit cell size.

SUMMARY OF THE INVENTION

It is therefore an object of the present invention to provide improved methods of operating memory devices.

It is a further object of the present invention to provide improved methods of testing highly integrated memory devices having embedded memory arrays therein.

These and other objects, advantages and features of the present invention are provided by methods of testing integrated circuits to include partial or complete data traversal path identification information (and related status information), preferably in test data streams. According to one embodiment of the present invention, methods of testing highly integrated buffer memory devices (e.g., first-in first-out (FIFO) memory devices) are provided. These memory devices may contain a custom tri-port memory array as a cache memory array of moderate capacity and a substantially larger capacity embedded supplemental memory array. A preferred tri-port memory array includes a read data port, a write data port and a bidirectional input/output port. Here, the tri-port memory array is electrically coupled to the highly integrated and substantially larger capacity supplemental memory array (e.g., DRAM array) which may contain a plurality of columns and rows of single-port memory cells. The tri-port memory array communicates internally with the embedded supplemental memory array via the bidirectional input/output poll and communicates with external devices (e.g., peripheral devices) via the read and write data ports and input/output driver circuits coupled to the read and write data ports.

Efficient steering circuitry is also provided in the memory device as a bidirectional crosspoint switch to electrically couple terminals of the bidirectional input/output port of the tri-port memory array in parallel to bit lines in the supplemental memory array during a write-to-memory time interval and vice versa during a read-from-memory time interval. Specialized control circuitry is also provided for controlling operation of the tri-port and supplemental memory arrays so that to the outside world the buffer memory device appears to have all the capacity of the large and highly integrated embedded supplemental memory array, and all the features and functionality of a conventional dual-port based buffer memory device (typically having much more limited capacity) such as extremely fast fall-through capability. The tri-port memory array may be designed as a plurality of separate registers of tri-port cells. Highly efficient parallel/serial transfer of data back and forth between all cells in a row of memory cells in the supplemental memory array and a selected register of tri-port cells in the tri-port memory array may also be provided. A minimum of four registers (e.g., register A, B, C and D) is provided in the tri-port memory array so that there is always a current read register, an immediately available next-to-read register, a current write register and an immediately available next-to-write register.

Preferred methods of operating and testing the memory device include the steps of writing first data from external to the buffer memory device into a first register within a tri-port memory array having a read port, a write port and a bidirectional input/output port. This step may be performed at a maximum write rate during burst write mode operation to fill the first write register during a minimum write-to-register time interval. This minimum write-to-register time interval typically has a duration that is a function of the width and depth of the first register, among other things. Then, a step may be performed to transfer all of the first data from the first register to the embedded supplemental memory array during a write-to-memory time interval which has a duration less than about one half the duration of the minimum write-to-register time interval. This transfer step is typically performed while additional write data is being written into another register in the tri-port memory array. For example, using the above described steering circuitry, the entire contents of the first register may be transferred via the bidirectional input/output port to a single row of memory cells in the supplemental memory array. To enable the data in the supplemental memory array to be read, a step may also be performed to transfer the first data from the row of memory cells back into the tri-port memory array, during a read-from-memory time interval which may have duration about equal to the write-to-memory time interval. Finally, a step may be performed to read the first data in a first-in first-out sequence from the second register, during a read-from-register time interval. This step may be performed at a maximum rate during burst read mode operation to read the second register during a minimum read-from-register time interval which typically equals the minimum write-to-register time interval.

Tri-port controller logic is provided for performing read and write arbitration operations to make next-to-read and next-to-write registers available in the tri-port memory array. To always maintain a source of available data for reading or available space for writing, even under worst case operating conditions including burst mode operation, the step of performing write arbitration comprises determining a next-to-write register as a first free register in the tri-port memory array if the current read and write registers are different registers, or as the next-to-read register if the current read and write registers are the same register. The step of performing read arbitration preferably comprises determining a next-to-read register as the current write register if the current write register contains next-to-read data relative to the data in the current read register. The step of performing read arbitration may also comprise determining the next-to-read register as a second free register in the tri-port memory array if the current read and write registers are different registers and the next-to-read register is not the current write register, or as the next-to-write register if the current read and write registers are the same register. The step of determining a next-to-read register as the second free register is closely followed by the step of transferring next-to-read data relative to the data in the current read register from the supplemental memory array to the second free register. By always maintaining a source of available read data using efficient transfers of next-to-read data from the supplemental memory array, the memory device can be operated to emulate dual-port FIFOs having fast fall-through capability.

As determined by the inventors herein, emulation of a tri-port memory array and embedded supplemental memory array as a dual-port FIFO can complicate operations to perform complete testing prior to shipment of the memory device to an end user. This is because the arbitration operations performed by the tri-port controller logic may cause seemingly random assignments of registers as read or write registers depending on, among other things, the number of write versus read operations and the phases of the asynchronous read and write clocks. Thus, it may be difficult to know, a priori (and even after the fact), the sequence of registers and related devices which received test data during test mode read and write operations. It may also be difficult to assess the operation of the control logic and/or isolate certain registers as read and write registers so that operation of these registers can be selectively tested. In particular, the asynchronous and independent operation of the read and write clocks can make the arbitration operations performed by the above described control logic appear undeterministic because the selection of read and write registers does not follow a predetermined sequence during write-to-register and read-from-register time intervals and during operations to transfer data from the embedded supplemental memory array to a selected register in the tri-port memory array.

To address these and other difficulties associated with test mode operation, the present invention provides preferred methods of testing buffer memory devices and other integrated circuit devices which can provide path identification information even when seemingly random and arbitrary assignments of internal data traversal paths (and devices in those paths) are selected. These methods include the steps of transferring test data into an integrated circuit containing devices therein and then controlling operation of the integrated circuit so that the test data traverses a first path through the devices therein. A step is then performed to retrieve at least a portion of the test data and an identification of at least a first portion of the first path from the integrated circuit. This path identification information can then be used to interpret the test data and operation of the integrated circuit. Here, the retrieving step may be preceded by the step of overwriting a first portion of the test data with an identification of the first portion of the first path. Thus, using the above described buffer memory device as an exemplary integrated circuit, an identification (e.g., address) of the current write register (receiving test data) may be "tagged" to a series of test words written into the current write register during test mode operation to test performance of the arbitration control circuitry, among other things. Similarly, when the test data is ultimately read from the buffer memory device, an identification of the current read register may be "tagged" to the series of test words being read from the current read register. According to preferred aspects of this reading step, the tagged identification may be interleaved into the stream of test data being read from the current read register, may be overwritten into the stream or may be separately stored in the device and then provided (along with other path identification and status information) as a serial or parallel stream of identification data from a test I/O pad.

For example, if the above-described tri-port/arbitration control circuitry has defined register A of the tri-port memory array as the current write register to receive test data at a particular point in time, a word (or multiple words) of data in register A may be reserved for register A identification information (e.g., register A address). Then, once register A has been filled with test data, the data contained therein (including the register identification information) may be transferred to a first row of memory in the embedded supplemental memory array during a write-to-memory time interval. Similarly, if at particular point in time register B is defined by the arbitration control circuitry as the next-to-write register while register A is being written to, then an identification of register B may be stored in register B. Then, once register B has been filled with test data, this test data along with the identification of register B can be transferred to a second row of memory in the supplemental memory array.

The test and identification data in the first and second rows of the supplemental memory may then be downloaded into current and next-to-read registers (e.g., registers C and D), respectively, during respective read-from-memory time intervals. The test data and identification data in the current and next-to-read registers may then be read from the tri-port memory array during consecutive read-from-register time intervals. During these reading steps, data identifying register-; C and D as the read registers (for their respective test data) may be interleaved into the data stream being read from the tri-port memory array, may be overwritten into the data stream or may be separately accessed from a test I/O pad. This write and read register identification information can then be extracted from the test data and used to interpret performance of the registers in the tri-port memory array and arbitration control circuitry, for example, during test mode operation.

The methods of the present invention may also include steps of recording status information (e.g., state of the embedded memory, the address of the row(s) of embedded memory receiving test data, counter and pointer values, flag status, etc.) and other device identification information pertinent to the test data being written into and read from the device under test. This information may be overwritten into the test data, may be interleaved into the test data during reading or may be separately stored in the device under test for immediate access during testing or subsequent access. Accordingly, the present invention provides improved methods of diagnosing the operation of an integrated circuit under test by providing data traversal path information and related information as a "window" into the operation of a device containing difficult to test devices, such as embedded memory and undeterministic control circuitry, for example.

DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
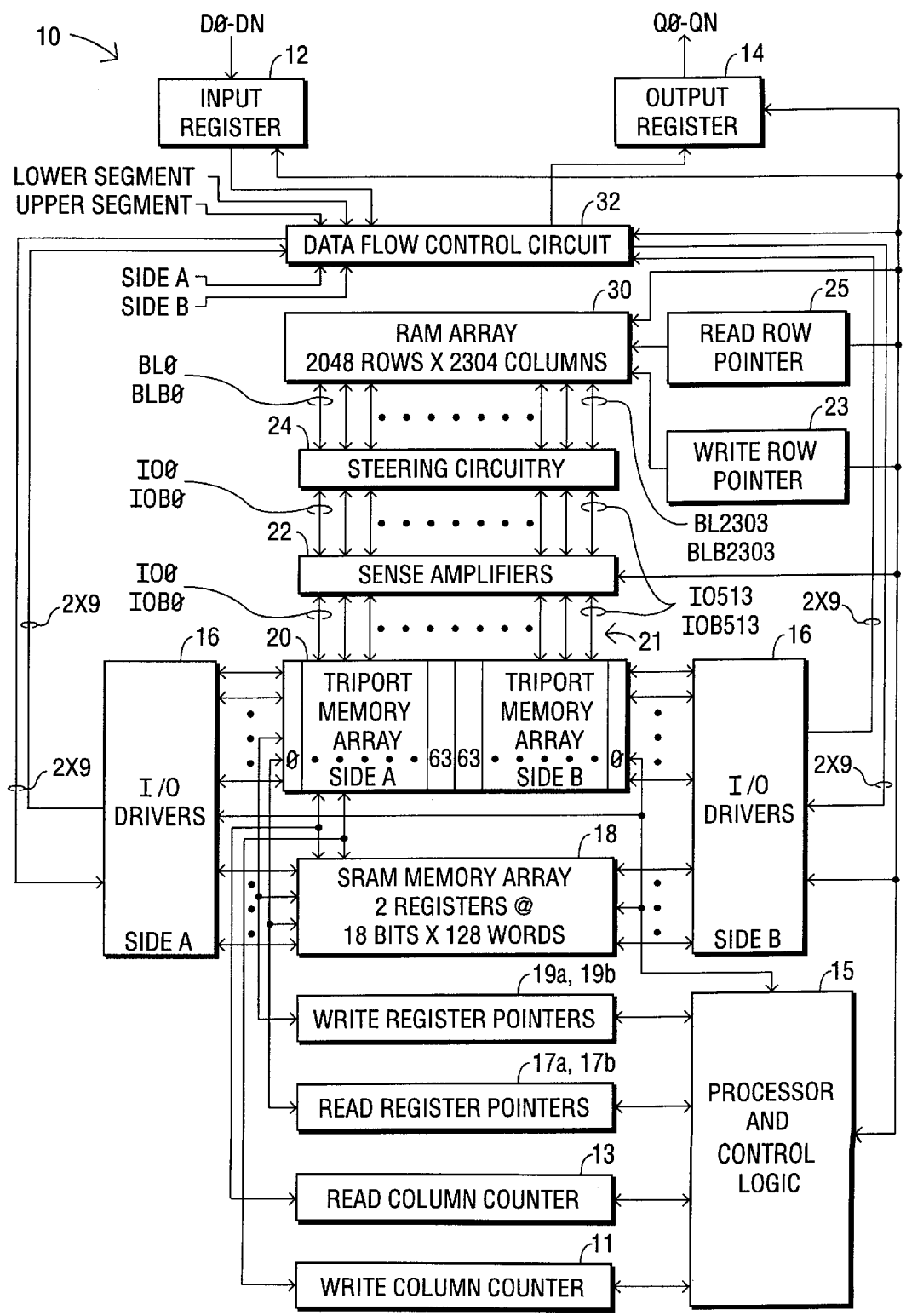
FIG. 1 is a block diagram of a first-in first-out (FIFO) buffer memory device which can be tested in accordance with the present invention.

Referring now to FIG. 1, a buffer memory device 10 which may be tested in accordance with a preferred embodiment of the present invention is illustrated. The preferred embodiment inlcudes methods include methods of testing buffer memory devices and other integrated circuits to retain partial or complete data traversal path identification information (and related status information), for test data applied during test mode operation. This information is particular useful when testing complicated integrated circuits, such as buffer memory devices containing embedded memories therein, prior to shipment to an end user. This is particularly useful because the control circuitry for the buffer memory device 10 of FIG. 1 may assign registers as read or write registers in a seemingly random sequence. Thus, it may be difficult to know, a priori (and even after the fact), the sequence of registers and related devices which received test data during test mode read and write operations. It may also be difficult to assess the operation of the control logic and/or isolate certain registers as read and write registers so that operation of these registers can be selectively tested.

To address these and other difficulties associated with the testing of complicated integrated circuits using test data, the present invention provides preferred methods of testing integrated circuit devices which provide path identification information even when seemingly random and arbitrary assignments of internal data traversal paths (and devices in those paths) are selected. These methods include the steps of transferring test data into an integrated circuit containing devices therein and then controlling operation of the integrated circuit so that the test data traverses a first path through the devices therein. A step is then performed to retrieve at least a portion of the test data and an identification of at least a first portion of the first path from the integrated circuit. This path identification information can then be used to interpret the test data and operation of the integrated circuit. Here, the retrieving step may be preceded by the step of overwriting a first portion of the test data with an identification of a first portion of the first path. Thus, with respect to a particular buffer memory device, an identification (e.g., address) of the current write register (receiving test data) may be "tagged" to a series of test words written into the current write register during test mode operation to test performance of the control circuitry therein, among other things. Similarly, when the test data is ultimately read from the buffer memory device, an identification of the current read register may be "tagged" to the series of test words being read from the current read register. According to preferred aspects of this reading step, the tagged identification may be interleaved into the stream of test data being read from the current read register, may be overwritten into the stream or the address may be separately stored in the device and then provided (along with other path identification and status information) as a serial or parallel stream of identification data from another input/output port(s).

Referring again to the exemplary buffer memory device of FIG. 1 to be tested, an input register 12 may be provided as an interface register so that normal input or test data (D0–Dn) to be written into the buffer memory device 10 can be supplied from an external peripheral device in a preferred parallel format. In particular, the input register 12 may be a 9-bit, 18-bit or 36-bit input register, for example, so that binary words or portions thereof may be simultaneously loaded into the buffer memory device 10. Similarly, an output register 14 may be provided as an interface register so that output data (Q0–Qn) to be read from the buffer memory device 10 can be supplied to an external peripheral device. As will be understood by those skilled in the art, in the event the buffer memory device 10 is embodied as an integrated circuit on a semiconductor chip, the input and output registers may be electrically connected to respective input and output pads (not shown) on the semiconductor chip.

As illustrated, the input register 12 and output register 14 may be electrically coupled by a multi-bit bus to a data flow control circuit 32. The data flow control circuit 32 is also electrically coupled via a plurality of multi-bit buses to a pair of input/output (I/O) driver circuits 16.

These input/output driver circuits 16 may comprise read and write drivers and sense amplifiers for transferring data to and from a dual-port or single-port memory array 18 (e.g., SRAM array) containing two registers therein (to support a retransmit function, if needed), and a tri-port memory array 20 (e.g., tri-port SRAM array) containing four tri-port registers (A,B,C and D) therein. Each of the tri-port registers may have the capacity of retaining 64 words of 36 bit data (i.e., 2304 bits) in 128 columns containing 18 tri-port SRAM cells each. This capacity may also be preferably configured as 256 words of 9 bit data or 128 words of 18 bit data, for example. In particular, in the event 36 bit words are used, improved writing and reading performance can be achieved by utilizing both input/output driver circuits 16 to simultaneously write or read the 18 bit LSB and 18 bit MSB portions of the 36 bit word into and from the tri-port memory array 20 during a single clock cycle.

According to a preferred aspect of present invention, the data flow control circuit 32 contains a crosspoint switch for facilitating bidirectional routing of data between the input and output registers 12 and 14 and the first and second input/output driver circuits 16 via the plurality of multi-bit (e.g., 9-bit) buses. As illustrated, the data flow control circuit 32 is responsive to lower and upper segment signals and side A and side B select signals. In particular, in the event the buffer memory device 10 is configured by a user or manufacturer to handle 36-bit input words, the lower and upper segment signals and side A and side B select signals may be generated internally by a processor and control logic circuit 15. These signals may be used to route an 18-bit LSB portion of each 36-bit word received by the input register 12 to the "SIDE A" input/output driver circuit 16 (using two 9-bit buses) in parallel with the routing of an 18-bit MSB portion of each 36-bit word to the "SIDE B" input/output driver circuit 16. The lower and upper segment signals may also be used to control routing of lower and upper segments of each 18-bit portion into lower (or upper) and upper (or lower) portions of each column of memory cells in the tri-port memory array 20, by selectively routing the lower and upper segments to a particular 9-bit bus using multiplexers internal to the data flow control circuit 32. This aspect of the data flow control circuit 32 can be particularly useful for users wanting to preserve or reconfigure data in big endian or little endian format during a write operation, and also eliminates the need to multiplex output data being read from the tri-port memory array 20, using multiplexers that are serially connected in the output paths and provide additional delay during reading operations. For example, in the event the memory device 10 is configured to enable writing of 9-bit words and reading of 18-bit words, the lower and upper segment signals may be utilized to control routing of two 9-bit input words into lower and upper portions of a single column of tri-port cells in the tri-port memory array 20 during consecutive write clock cycles so that 18-bit words can be retrieved directly (in the user selected little or big endian format) during read operations which require only one read clock cycle.

As described more fully hereinbelow, the tri-port memory array 20 includes a bidirectional input/output port 21 that is electrically coupled to a supplemental single-port memory array 30 (e.g., DRAM or SRAM array). Based on the above described capacity for each tri-port register of 64 words of 36 bit data, the bidirectional input/output port may be preferably configured as 514 tri-port terminals which are each comprised of a pair of input/output lines IO and IOB (i.e., $(IO_0, IOB_0), \ldots, (IO_{513}, IOB_{513})$). An array 22 of sense amplifiers (e.g., linear array of 514 sense amplifiers) is also electrically coupled at a first end to the bidirectional input/output port, as illustrated. As will be understood by those skilled in the art, precharge and line equalization circuits (not shown) may be provided to set each input/output line $IO_n$ and complementary input/output line $IOB_n$ at the same potential (e.g., ½(Vdd–Vss)) just prior to performance of a sense operation for determining the relative differential states of one or more input/output line pairs upon application of data thereto and then driving the lines in a pair to opposing rail voltages (e.g., Vss and Vdd). To reduce excessive power consumption caused by unnecessary charging of input/output lines being sensed, the array 22 of sense amplifiers preferably includes multiplexer circuits to isolate the input/output lines on one side of the array 22 when the input/output lines on the other side are being driven rail-to-rail. Thus, when a slight differential potential is established across a respective input/output line pair $IO_n$ and $IOB_n$ on the side of the tri-port memory array 20 (i.e., the "sensed" side) during an operation to transfer tri-port data to the supplemental memory array 30, the respective input/output lines on the side of the steering circuitry 24 are driven rail-to-rail but the corresponding input/output lines on the sensed side are allowed to float. Similarly, when a slight differential potential is established across a respective input/output line pair $IO_n$ and $IOB_n$ on the side of the steering circuitry 24 during an operation to fetch data from the supplemental memory array 30, the respective input/output lines on the tri-port side of the array 22 are driven rail-to-rail but the lines being sensed are allowed to float.

Preferred steering circuitry 24, in the form of a crosspoint switch, is also electrically coupled between a second end of the array 22 of sense amplifiers and the supplemental memory array 30. As described more fully hereinbelow, the crosspoint switch contains multiplexer and demultiplexer circuits therein to selectively route a reduced number of pairs of input/output lines IO and IOB at the bidirectional input/output port to a greater number of pairs of bit lines BL and BLB and vice versa, in response to register transfer and column select signals. Each of these pairs of bit lines BL and BLB may be electrically coupled to a respective column of memory cells in the supplemental memory array 30. As illustrated, the preferred steering circuitry 24 may be provided for routing 514 pairs of input/output lines to 2304 pairs of bit lines in the supplemental memory array 30 containing 2K rows. These 2K rows of memory cells may be formed by grouping together eight (8) blocks of memory having 256 rows each, for example. Moreover, by routing less than one-quarter the number of bit lines as data input/output lines, the substantially greater layout pitch requirements of the input/output lines IO and IOB (relative to the bit lines BI and BLB) can be accommodated.

Referring still to FIG. 1, processor and tri-port control logic 15 is also provided for controlling operation of the above-described circuits during both normal and test mode operation. Test mode operation may be entered using any one of a number of conventional techniques, including use of a dedicated test pin (not shown), sequence detector, status bit within a register or high detect circuit, for example. The control logic 15 utilizes information provided by a number of counters, pointers and registers and related hardware to control operation of the buffer memory device 10 as a sequential buffer memory device (e.g., FIFO, LIFO). As described more fully hereinbelow with respect to FIGS. 6–10, the control logic 15 may utilize information provided by (1) a write-column counter 11 which designates a column of tri-port memory cells receiving current write data, (2) a read-column counter 13 which designates a column of tri-port memory cells from which current read data is being read, (3) write register pointers 19a, 19b which may designate a current write register and a next-to-write register in the tri-port memory array 20, respectively, (4) read register pointers 17a, 17b which may designate a current read register and a next-to-read register in the tri-port memory array 20, respectively, (5) a read row counter/pointer 25 which may point to a row in the supplemental memory array 30 that contains data to be loaded into the next-to-read register, and (6) a write row counter/pointer 23 which may point to a row in the supplemental memory array 30 which is to receive data in the current write register.

In contrast to the tri-port memory array 20 which is electrically coupled to the supplemental memory array 30, the dual-port or single-port memory array 18 may be operated as a retransmit memory buffer so that a retransmit-from-mark operation may be performed with zero cycle latency. In particular, the single or dual-port memory array 18 may contain data which immediately follows data that was marked during reading operations. Then, upon receipt of a retransmit-from-mark request by a user, the retransmit data in the memory array 18 may be immediately read while operations are simultaneously performed to transfer additional retransmit data from the supplemental memory array 30 to the tri-port memory array 20. This additional retransmit data can then be read from the tri-port memory array 30 once all the data in the single or dual-port memory array 18 has been read.

Figure 2:
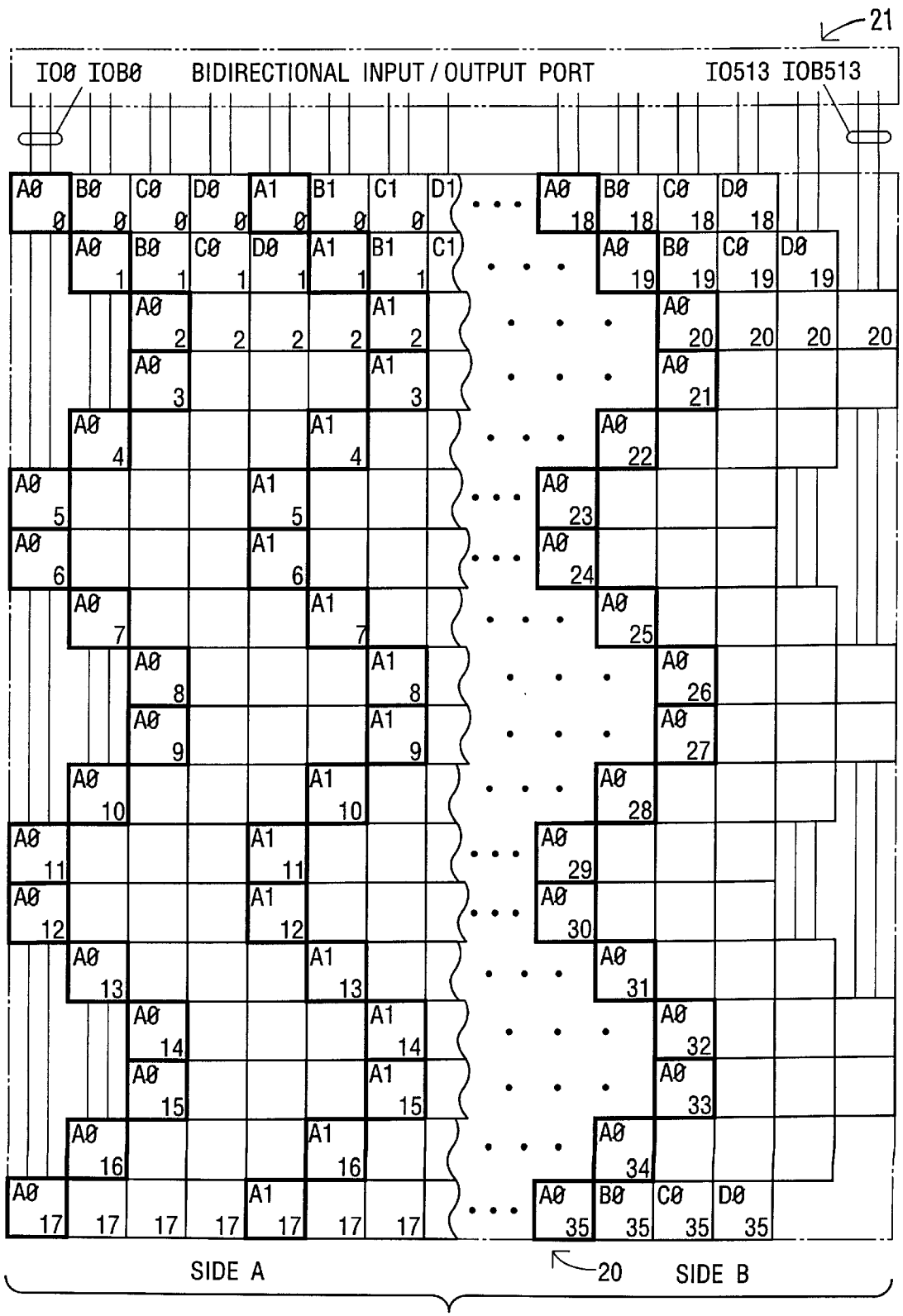
FIG. 2 is a block layout schematic that illustrates a tri-port memory array containing four bifurcated registers of tri-port memory cells arranged as a plurality of serpentine-shaped columns of memory cells.

Referring now to FIG. 2, a first tri-.port register (e.g., register A) may be defined as two subarrays of tri-port memory cells with each subarray containing 64 serpentine-shaped columns A0–A63 positioned side-by-side at spaced locations. The first subarray may be located on side A of the tri-port memory array 20 and the second subarray may be located on side B. The tri-port memory cells on side A are also electrically coupled by respective read and write data lines ((RB, RBB) and (VVB, WBB)) to the side A input/output driver circuit 16 and the tri-port memory cells on side B are electrically coupled by respective read and write data lines to the side B input/output driver circuit 16, as illustrated best by FIGS. 1 and 3. In the first columns A0 of the first tri-port register A, cells 0–17 and 18–35 are aligned as a nonlinear columns at opposite sides of the tri-port array 20. Each of the first columns A0 has three (3) cells for each of six (6) staggered segments which trace a zig-zag pattern. The 63rd column A63 on side A of the first tri-port register A contains cells 0–17 and the $63^{rd}$ column A63 on side B contains cells 18–35. As illustrated, the columns may be arranged side-by-side in each subarray with the lower order columns (e.g., A0) extending adjacent opposite ends of the tri-port array 20 and the higher order columns (e.g., A63) extending adjacent the middle of the array 20. Thus, when viewed from left-tc-right, the columns of register A may be arranged in the following sequence: $A0_{0-17}$, $A1_{0-7}$, $A2_{0-17}, \ldots, A63_{0-17}, A63_{18-35}, A62_{18-35}, \ldots, A0_{18-35}$, although other arrangements may be provided based on a preferred column decoder design.

Based on this preferred configuration, a 36-bit word can be written as first and second 18-bit subwords into tri-port cells $A0_{0-17}$ and $A0_{18-35}$ during a single write clock cycle, and then another 36-bit word can be split into subwords by the data flow control circuit 32 and written into tri-port cells $A1_{0-17}$ and $A1_{18-35}$ during a subsequent write clock cycle. These writing steps can be repeated with respect to register A until tri-port cells $A63_{0-17}$ and $A63_{18-35}$ have received the $_{64}$th word. According to another preferred configuration which utilizes the lower and upper segment signals generated by the processor and control logic 15, four 9-bit words can be loaded into tri-port cells $A0_{0-8}$, $A0_{9-17}$, $A0_{18-26}$ and $A0_{27-35}$ during four consecutive write clock cycles and then these four 9-bit words can be read from columns A0 as a single 36-bit word during a single read clock; cycle.

Figure 3:
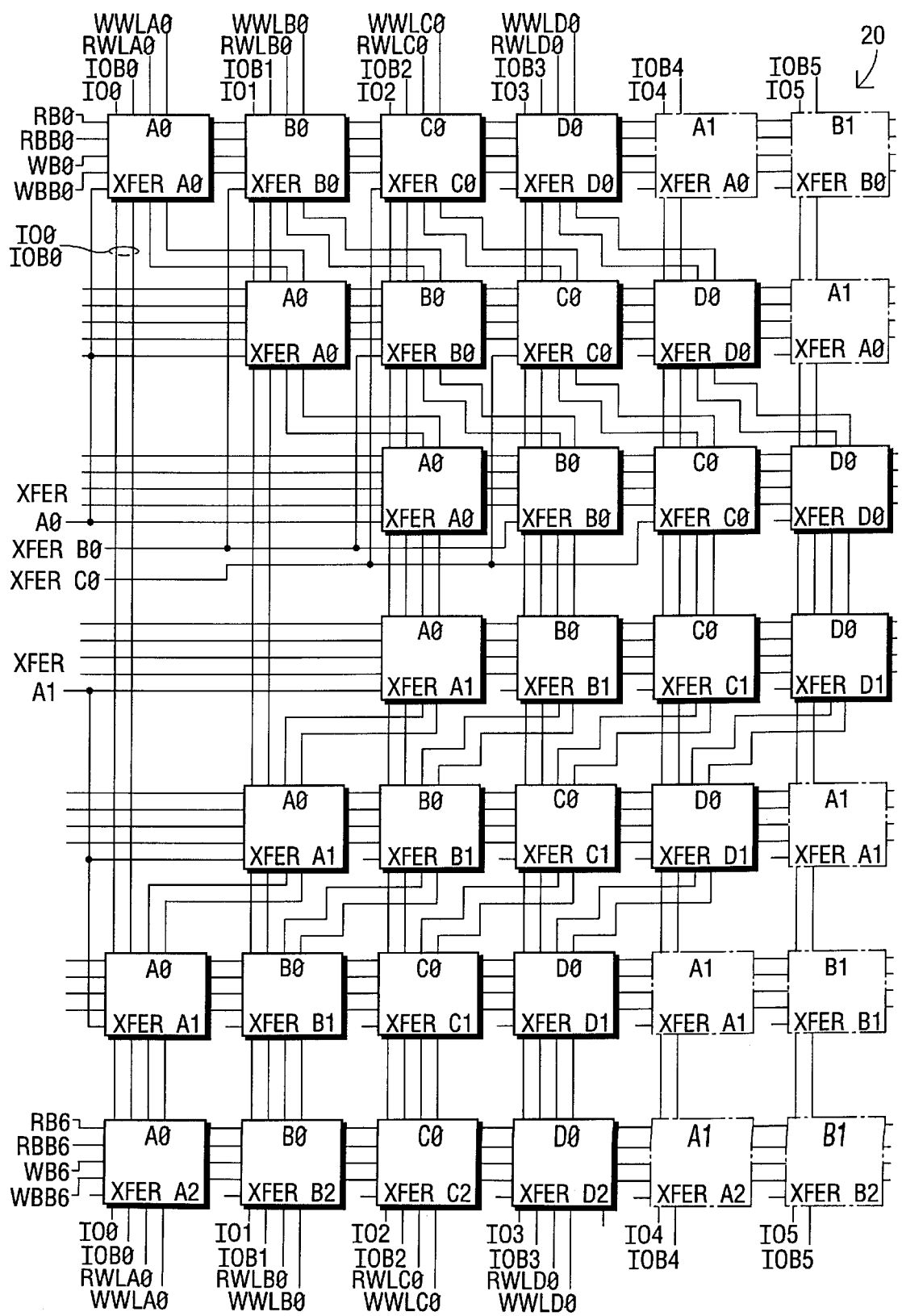
FIG. 3 is an electrical schematic that illustrates the electrical interconnections between tri-port cells 0–6 in columns A0, B0, C0 and D0, according to the tri-port memory array of FIG. 2.

Referring now to FIG. 3, an electrical schematic is provided to further illustrate the electrical interconnections between the tri-port cells 0–6 in columns A0, B0, C0 and D0 of FIG. 2. The other tri-port cells in the tri-port memory array 20 are similarly connected. In particular, read word lines (RWL) and write word lines (WWL) are provided as a pair of adjacent serpentine-shaped word lines for each nonlinear column of cells. For example, the lower order column A0 of register A is responsive to lines RWLA0 and WWLA0 which trace a zig-zag pattern, as illustrated. Similarly, columns B0, C0 and D0 are responsive to respective word lines: (RWLB0, WWLB0), (RWLC0, WWLC0) and (RWLD0, WWLD0). Pairs of parallel differential input/output lines (IO0, IOB0), (IO1, IOB1), . . . , (IO5, IOB5) are also provided in a vertical direction. Each of these pairs of input/output lines comprises a terminal of the above-described bidirectional input/output port 21. According to the layout of cells illustrated by FIG. 2, lines IO0 and IOB0 span six (6) cells in column A0, lines IO1 and IOB1 span six (6) cells in each of columns B0 and A0, lines IO2 and IOB2 span six (6) cells in each of columns C0, B0 and A0, lines IO3 and IOB3pan six (6) cells in each of columns D0, C0 and B0, lines IO4 and IOB4 span six (6) cells in each of columns A1, C0 and D0 and lines IO5 and IOB5 span six (6) cells in each of columns B1, A1 and D0. Horizontal, read and write data lines ((RB0, RBB0), ..., (RB17, RBB17)) and ((WB0, WBB0), ..., (WB17, WBB17)) on side A of the array 20 are also electrically coupled to the side A input/ output driver circuit 16. These data lines extend across rows of tri-port cells so that read and write data can be efficiently transferred between the side A input/output driver circuit 16 and the columns of tri-port cells on side A of the tri-port memory array 20. Similarly, read and write data lines ((RB18, RBB18), ..., (RB35, RBB35)) and ((WB18, WBB18), ..., (WB35, WBB35)) on side B of the array 20 are electrically coupled to the side B input/output driver circuit 16.

As described more fully hereinbelow with respect to FIG. 5, complementary data (e.g., DATA, DATAB) stored at latched internal nodes of a selected tri-port memory cell may be provided to a respective pair of vertical input/output lines by providing a respective transfer signal to the selected cell. The transfer signals include six (6) transfer signals for each of the four (4) registers of tri-port cells in the tri-port memory array 20. In FIG. 3, the transfer signals are illustrated as XFERA0, XFERA1 and XFERA2, XFERB0, XFERB1 and XFERB2, XFERC0, XFERC1 and XFERC2 and XFERD0, XFERD1 and XFERD2. Each of these illustrated transfer signals is electrically coupled to a corresponding group of three (3) staggered cells within the same column. For example, transfer signal XFERA0 can be applied as a logic 1 signal to cells 0–2 of column A0 during a first portion of a write-to-memory time interval so that complementary data within cells 0–2 can be simultaneously transferred to the first three pairs of input/output lines (IO0, IOB0), (IO1, IOB1) and (IO2 and IOB2), respectively. At the same time, the first three (3) bits of column A1 are being transferred to input/output lines (IO4, IOB4), (IO5, IOB5) and (IO6, IOB6). Similarly, the first three (3) bits of all 128, columns of register A are transferred together. Note, that IO3 and IOB3 are not used during this transfer operation as they do not serve the A register. Thus, 384 bits of data (3 bits×128 columns) from cells 0–2 of register A can be simultaneously transferred to 384 of the 514 ports in the bidirectional input/output port 21 illustrated by FIGS. 2 and 3. This transfer of complementary data can then be sensed and amplified by the array 22 of sense amplifiers using techniques well known to those skilled in the art. Transfer signal XFERA1 can be applied as a logic 1 signal to cells 3–5 of column A0 during a second portion of a write-to-memory time interval so that complementary data within cells 5, 4 and 3 can be simultaneously transferred to input/output lines (IO0, IOB0), (IO1, IOB1) and (IO2 and IOB2), respectively.

Following in the same manner, transfer signal XFERA2 can be applied as a logic 1 signal to cells 6–8 of column A0 during a third portion of a write-to-memory time interval so that complementary data within cells 6, 7 and 8 can be simultaneously transferred to input/output lines (IO0, IOB0), (IO1, IOB1) and (IO2 and IOB2), respectively. Similarly, transfer signal XFERA3 (not shown) can be applied as a logic 1 signal to cells 9–11 of column A0 during a fourth portion of a write-to-memory time interval so that complementary data within cells 11, 10 and 9 can be simultaneously transferred to input/output lines (IO0, IOB0), (IO1, IOB1) and (IO2 and IOB2), respectively. Transfer signal XFERA4 (not shown) can also be applied as a logic 1 signal to cells 12–14 of column A0 during a fifth portion of a write-to-memory time interval so that complementary data within cells 12, 13 and 14 can be simultaneously transferred to input/output lines (IO0, IOB0), (IO1, IOB1) and (IO2 and IOB2), respectively. Finally, transfer signal XFERA5 (not shown) can be applied as a logic 1 signal to cells 15–17 of column A0 during a sixth portion of a write-to-memory time interval so that complementary data within cells 17, 16 and 15 can be simultaneously transferred to input/output lines (IO0, IOB0), (IO1, IOB1) and (IO2 and IOB2), respectively.

By a similar method of operation with respect to register B, transfer signal XFERB0 can be applied as a logic 1 signal to cells 0–2 of column B0 during a first portion of a write-to-memory time interval so that complementary data within each cell can be simultaneously transferred to the second, third and fourth pairs of input/outputs lines (IO1, IOB1), (IO2, IOB2) and (IO3 and IOB3), respectively. As described more fully hereinbelow with respect to FIGS. 4A–4D, the above described operations can be repeated to load the entire contents of register A, register B, register C or register D one-at-a-time into a row(s) of memory cells in the supplemental memory array 30, during respective write-to-memory time intervals which may have a duration of less than about 200 ns. Using similar operations, the entire contents of a row of memory cells in the supplemental memory array 30 (e.g., 2304 bit,,) may be loaded into a register during six (6) consecutive portions of a read-from-memory time interval (i.e., "fetch" interval).

These write-to-memory and read-from-memory operations may be more fully understood with reference to TABLES 1–4 below. In particular, TABLE 1 illustrates a possible sequence of parallel data transfers from the tri-port register A illustrated by FIG. 2 to a single row (or possibly a plurality of rows) of memory cells in the supplemental memory array 30, during a write-to-memory time interval which may contain six nonoverlapping transfer intervals therein. TABLES 2–4 similarly illustrate the sequence of parallel data transfers from registers B, C and D, respectively, to the supplemental memory array 30.

TABLE 1

| TRANSFER SIGNAL | WORD0 LSB | WORD1 LSB | WORD63 ... LSB | WORD63 MSB | WORD0 ... MSB |
|---|---|---|---|---|---|
| XFERA0: | A0(0–2) | A1(0–2) | ... A63(0–2) | A63(18–20) | ... A0(18–20) |
| XFERA1: | A0(3–5) | A1(3–5) | ... A63(3–5) | A63(21–23) | ... A0(21–23) |
| XFERA2: | A0(6–8) | A1(6–8) | ... A63(6–8) | A63(24–26) | ... A0(24–26) |
| XFERA3: | A0(9–11) | A1(9–11) | ... A63(9–11) | A63(27–29) | ... A0(27–29) |
| XFERA4: | A0(12–14) | A1(12–14) | ... A63(12–14) | A63(30–32) | ... A0(30–32) |
| XFERA5: | A0(15–17) | A1(15–17) | ... A63(15–17) | A63(33–35) | ... A0(33–35) |

TABLE 2

| TRANSFER SIGNAL | WORD0 LSB | WORD1 LSB | ... WORD63 LSB | WORD63 MSB | ... WORD0 MSB |
|---|---|---|---|---|---|
| XFERB0: | B0(0–2) | B1(0–2) | ... B63(0–2) | B64(18–20) | ... B0(18–20) |
| XFERB1: | B0(3–5) | B1(3–5) | ... B63(3–5) | B64(21–23) | ... B0(21–23) |
| XFERB2: | B0(6–8) | B1(6–8) | ... B63(6–8) | B64(24–26) | ... B0(24–26) |
| XFERB3: | B0(9–11) | B1(9–11) | ... B63(9–11) | B64(27–29) | ... B0(27–29) |
| XFERB4: | B0(12–14) | B1(12–14) | ... B63(12–14) | B64(30–32) | ... B0(30–32) |
| XFERB5: | B0(15–17) | B1(15–17) | ... B63(15–17) | B64(33–35) | ... B0(33–35) |

TABLE 3

| TRANSFER SIGNAL | WORD0 LSB | WORD1 LSB | ... WORD63 LSB | WORD63 MSB | ... WORD0 MSB |
|---|---|---|---|---|---|
| XFERC0: | C0(0–2) | C1(0–2) | ... C63(0–2) | C64(18–20) | ... C0(18–20) |
| XFERC1: | C0(3–5) | C1(3–5) | ... C63(3–5) | C64(21–23) | ... C0(21–23) |
| XFERC2: | C0(6–8) | C1(6–8) | ... C63(6–8) | C64(24–26) | ... C0(24–26) |
| XFERC3: | C0(9–11) | C1(9–11) | ... C63(9–11) | C64(27–29) | ... C0(27–29) |
| XFERC4: | C0(12–14) | C1(12–14) | ... C63(12–14) | C64(30–32) | ... C0(30–32) |
| XFERC5: | C0(15–17) | C1(15–17) | ... C63(15–17) | C64(33–35) | ... C0(33–35) |

TABLE 4

| TRANSFER SIGNAL | WORD0 LSB | WORD1 LSB | ... WORD63 LSB | WORD63 MSB | ... WORD0 MSB |
|---|---|---|---|---|---|
| XFERD0: | D0(0–2) | D1(0–2) | ... D63(0–2) | D63(18–20) | ... D0(18–20) |
| XFERD1: | D0(3–5) | D1(3–5) | ... D63(3–5) | D63(21–23) | ... D0(21–23) |
| XFERD2: | D0(6–8) | D1(6–8) | ... D63(6–8) | D63(24–26) | ... D0(24–26) |
| XFERD3: | D0(9–11) | D1(9–11) | ... D63(9–11) | D63(27–29) | ... D0(27–29) |
| XFERD4: | D0(12–14) | D1(12–14) | ... D63(12–14) | D63(30–32) | ... D0(30–32) |
| XFERD5: | D0(15–17) | D1(15–17) | ... D63(15–17) | D63(33–35) | ... D0(33–35) |

Referring still to FIG. 3, two groups of four (4) horizontal data lines are also provided for each row (e.g., 18 rows) of tri-port cells in the tri-port memory array 20. As will be understood by those skilled in the art, these data lines are preferably electrically coupled to the left or right side I/O circuits 16 of FIG. 1. As illustrated, left side data lines for each row of cells include two (2) complementary read data lines RB and RBB and two (2) complementary write data lines WB and VNBB. These left side data lines are electrically coupled to the 64 left side columns (0–63) of each of registers A, B, C and D. Right side data lines (not shown) are electrically coupled to the 64 right side columns (63–0) of each of registers A, B, C and D. Here, the use of separate right side and left side data lines enables the simultaneous loading of 36 bits of data as a first group of 18 bits and a second group of 18 bits, into respective left side and right side columns having 18 tri-port cells therein.

Figure 4A:
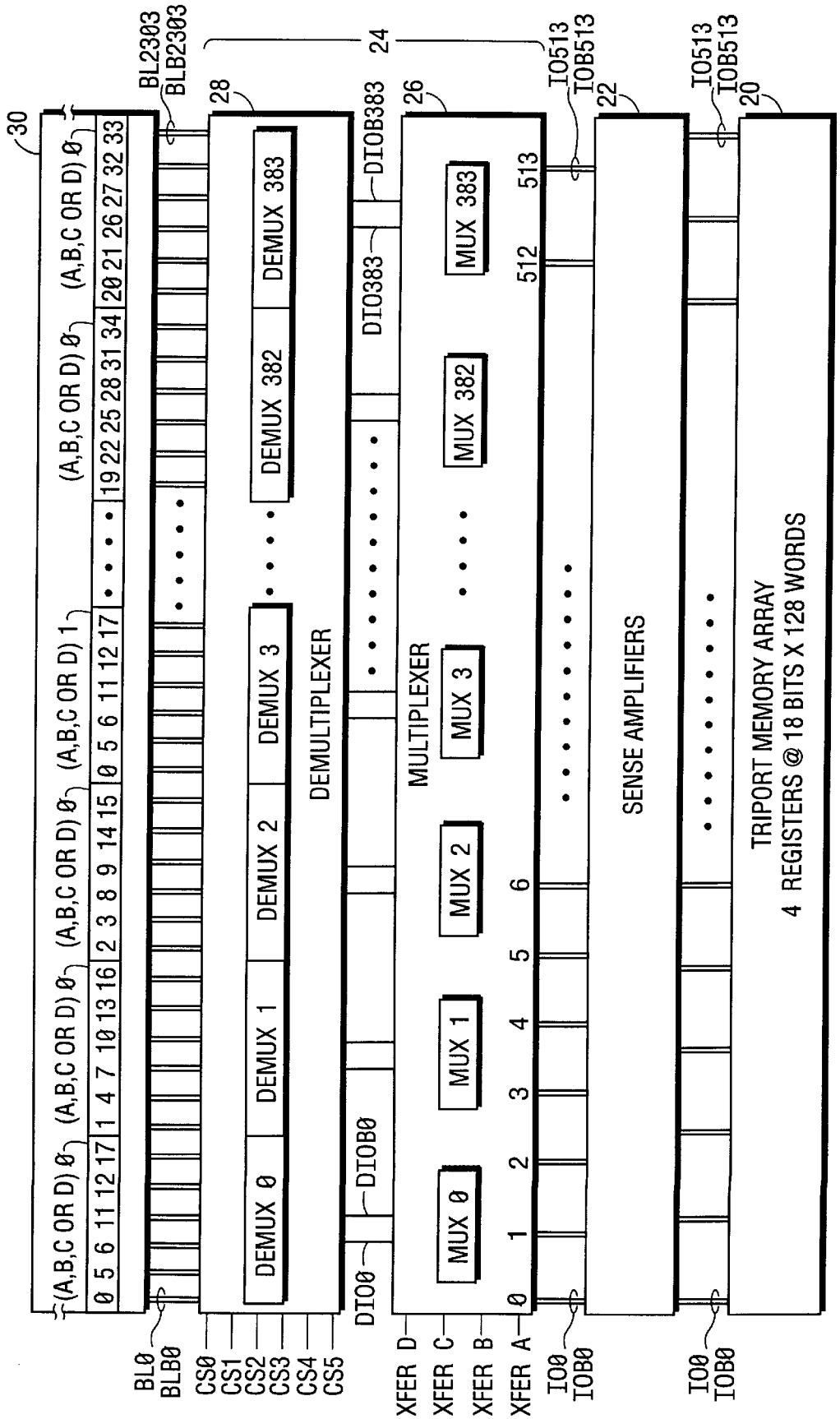
FIG. 4A is a schematic of the preferred steering circuitry of FIG. 1.

Referring now to FIG. 4A, a top-level electrical schematic of the preferred steering circuitry of FIG. 1 is provided. As will become evident from the following description, the steering circuitry 24 enables the highly efficient parallel/serial transfer of multiple bits of data from each column of tri-port cells in a register thereof to a row(s) of memory cells in the supplemental memory array 30 during a respective portion of a write-to-memory time interval and vice versa during a respective portion of a read-from-memory time interval. Using this steering circuitry 24, it is possible to obtain parallel/serial transfer of data from all 18 cells within each of the 128 columns in a register in the tri-port memory array 20 to the supplemental memory array 30 and vice versa in only six sequential steps with reduced layout wiring penalty. This advantage may be achieved even if the columns of tri-port cells in the registers are aligned in a generally orthogonal direction relative to a row of memory cells in the supplemental memory array 30.

Figure 4B:
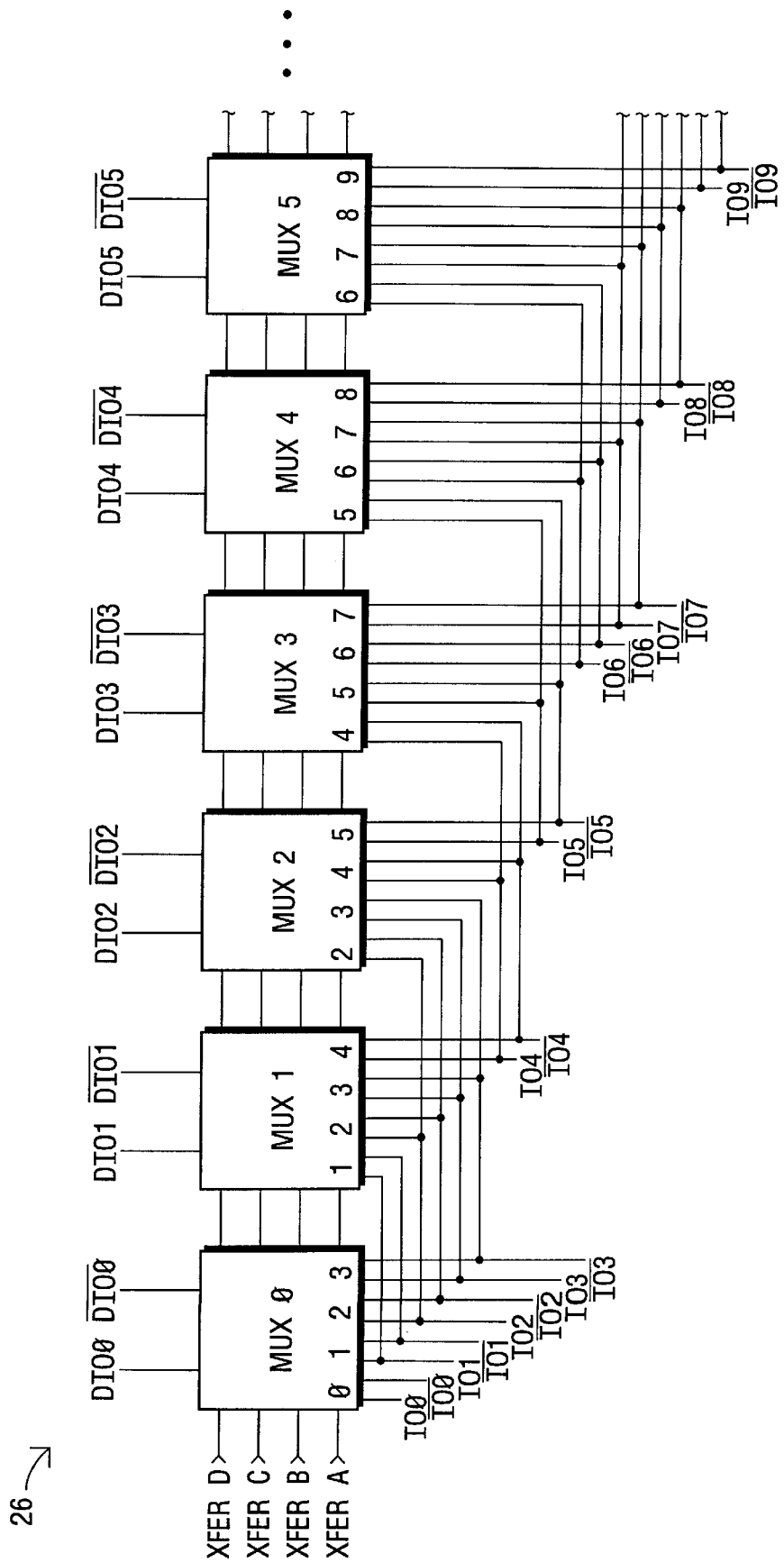
FIG. 4B is a block electrical schematic of the multiplexer circuit of FIG. 4A.
Figure 4C:
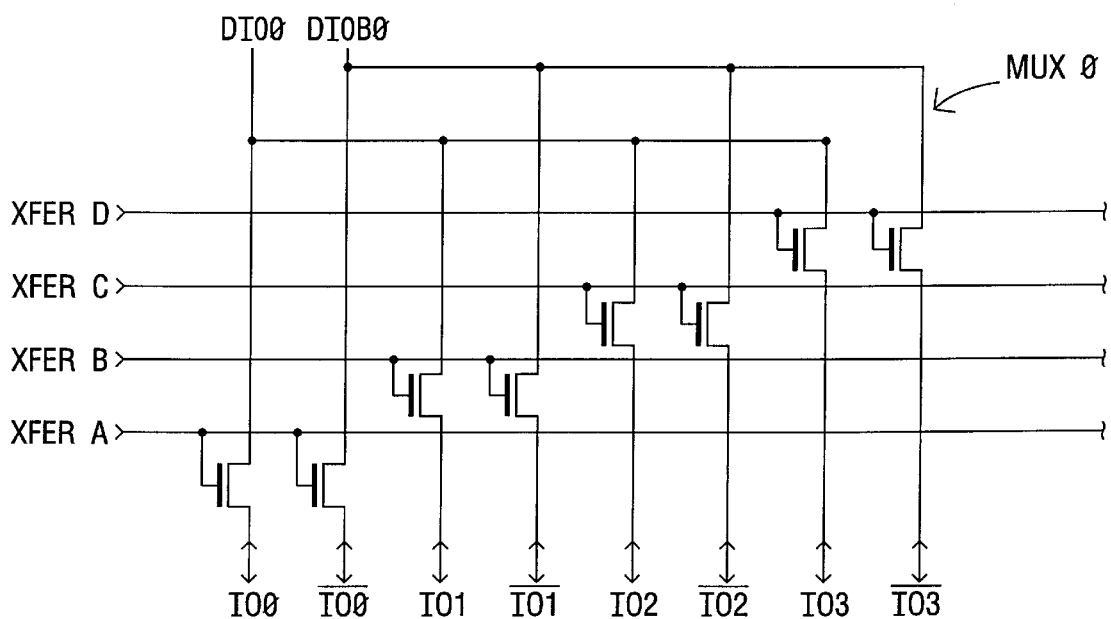
FIG. 4C is an electrical schematic of a multiplexer of FIG. 4B.
Figure 4D:
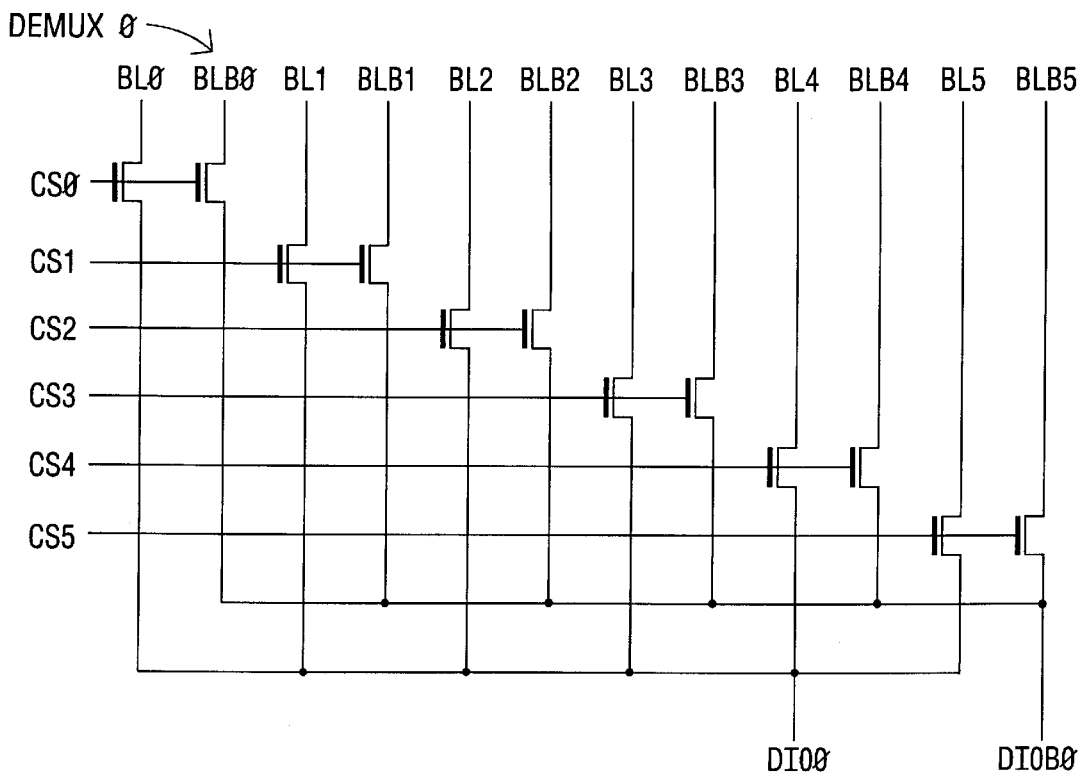
FIG. 4D is an electrical schematic of a demultiplexer of FIG. 4A.

In particular, the steering circuitry 24 of FIG. 4A includes an array 26 of 4-input multiplexers (MUX0–MUX3833) which are responsive to a plurality of register transfer signals XFERA, XFERB, XFERC and XFERD. A portion of this array 26 is also illustrated by F-IG. 4B. Referring now to FIGS. 4B–4C, each MUX comprises four (4) pairs of pass transistors which electrically couple one of four pairs of input/output lines (e.g., (IOC1, IOB0), (IO1, IOB1), (IO2, IOB2) and (IO3, OOB3)) to a single pair of data input/output lines (DIO0, DIOB0). The gate electrodes of each pair of pass transistors are also responsive to application of a respective register transfer signal thereto. Thus, the register transfer signals XFERP–XFERD can be used to selectively couple each pair of input/output lines to the data input/output lines (DIO0, DIOB0).

The steering circuitry 24 also includes a plurality of demultiplexers (DEMUX0–DEMUX383) 28 for routing each of the plurality of decoded input/output lines {(DIO0, DIOB0), . . . , (DIO383, DIOB383)} to one of a plurality (e.g., 6) of pairs of adjacent bit lines {(BL0, BLB0), (BL2303, BLB2303)}. As illustrated best by FIG. 4D, each of these demultiplexers is responsive to six (6) column select signals (CS0–CS5). Thus, during a first portion of a write-to-memory time interval, signals XFERA0, XFERA and CS0 can be simultaneously set to logic 1 values to enable the parallel transfer of data from cells 0–2 in columns A0–A63 on side A and cells 18–20 in columns A63–A0 on side B, to a row of memory cells in the supplemental memory array 30. In particular, these 384 bits of data can be simultaneously loaded into every sixth consecutive cell within the row (e.g., rows 0, 6, 12, 18, . . . ). Next, during a second portion of a write-to-memory time interval, signals XFERA1, XFERA and CS1 can be simultaneously set to logic 1 values to enable the parallel transfer of data from cells 3–5 in columns A0–A63 on side A and cells 21–23 in columns A63–A0 on side B, to the same row (or a different row) of memory cells in the supplemental memory array 30, as illustrated. Accordingly, data from each nonlinear column of tri-port cells in a register can be loaded into a block of adjacent memory cells in the same row in the supplemental memory array 30.

More specifically, the array 26 of 4-input multiplexers (MUX0–MUX383) is arranged so that MUX0–MUX2 control the routing of data between columns A0, B0, C0 and D0 of the tri-port memory array 20 and the first 18 pairs of bit lines BL and BLB (i.e., BL0, BLB0 to BL17 and BLB17). Similarly, multiplexers MUX3–MUX5 control the routing of data between columns A1, B1, C1 and D1 of the tri-port memory array 20 and the second 18 pairs of bit lines BL and BLB and multiplexers MUX6–MUX8 control the routing of data between columns A2, B2, C2 and D2 of the tri-port memory array 20 and the third 18 pairs of bit lines BL and BLB. Here, each of the input/output lines IO and IOB illustrated by FIG. 4B are electrically coupled to three multiplexers (except for those at each end).

As illustrated best by FIGS. 4A and 4B, during a transfer of data from register A in the tri-port memory array 20 to the supplemental memory array 30, the first 18 memory cells in a row of memory in the supplemental memory array 30 receive data from tri-port cells in a predetermined group sequence (|0,5,6,11,12,17|, |1, 4,7,10,13,16| and |2,3,8,9,14, 15|). If XFERA0 and XFERA are set to logic 1 potentials and column select signal CS0 is also set high, the data in cell 0 of column A0 (provided to port 0 of the bidirectional port 21) can be passed through MUX0 and DEMUX0 to bit lines BL0 and BLB0. Similarly and simultaneously, the data in cell 1 of column A0 can be passed through MUX1 and DEMUX1 to bit lines BL6 and BLB6 and the data in cell 2 of column A0 can be passed through MUX2 and DEMUX2 to bit lines BL12 and BLB12. Likewise, if instead XFERA1 and XFERA are set to logic 1 potentials and column select signal CS1 is also set high, the data in cell 5 of column A0 (provided to port 0 of the bidirectional port 21) can be passed through MUX0 and DEMUX0 to bit lines BL1 and $BLB_1$, the data in cell 4 of column A0 can be passed through MUX1 and DEMUX1 to bit lines BL7 and BLB7 and the data in cell 3 of column A0 can be passed through MUX2 and DEMUX2 to bit lines BL13 and BLE313.

With respect to column A1 of register A, if XFERA0 and XFERA are set to logic 1 potentials and column select signal CS0 is also set high, the data in cell 0 of column A1 (provided to port 4 of the bidirectional port 21) can be passed through MUX3 and DEMUX3 to bit lines BL18 and BLB18, the data in cell 1 of column A1 (provided to port 5 of the bidirectional port 21) can be passed through MUX4 and DEMUX4 to bit lines BL24 and BLB24 and the data in cell 2 of column A1 (provided to port 6 of the bidirectional port 21) can be passed through MUX5 and DEMUX5 to bit lines BL30 and BLB30. Continuing with respect to column A1 of register A, if XFERA1 and XFERA are set to logic 1 potentials and column select signal CS1 is also set high, the data in cell 5 of column A1 (provided to port 4 of the bidirectional port 21) can be passed through MUX3 and DEMUX3 to bit lines BL19 and BLB19, the data in cell 4 of column A1 (provided to port 5 of the bidirectional port 21) can be passed through MUX4 and DEMUX4 to bit lines BL25 and BLB25 and the data in cell 3 of column A1 (provided to port 6 of the bidirectional port 21) can be passed through MUX5 and DEMUX5 to bit lines BL31 and BLB31. Accordingly, on a column-by-column basis, the steering circuitry 24 provides a routing of a selected one of four (4) ports to three (3) pairs of data input/output lines to eighteen (18) bit line pairs.

Figure 5:
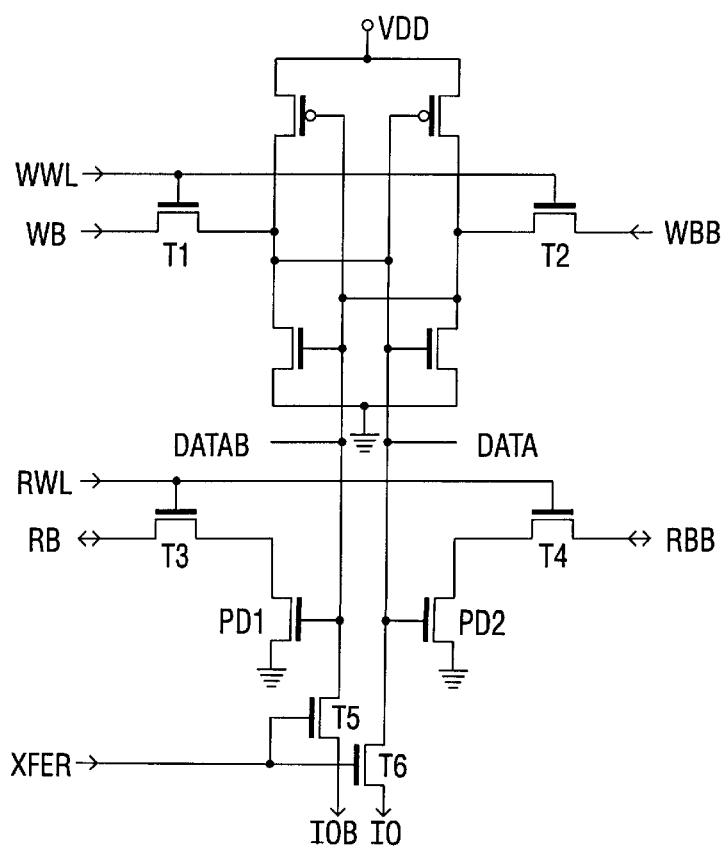
FIG. 5 is an electrical schematic of a tri-port cell of FIG. 3.
Figure 6:
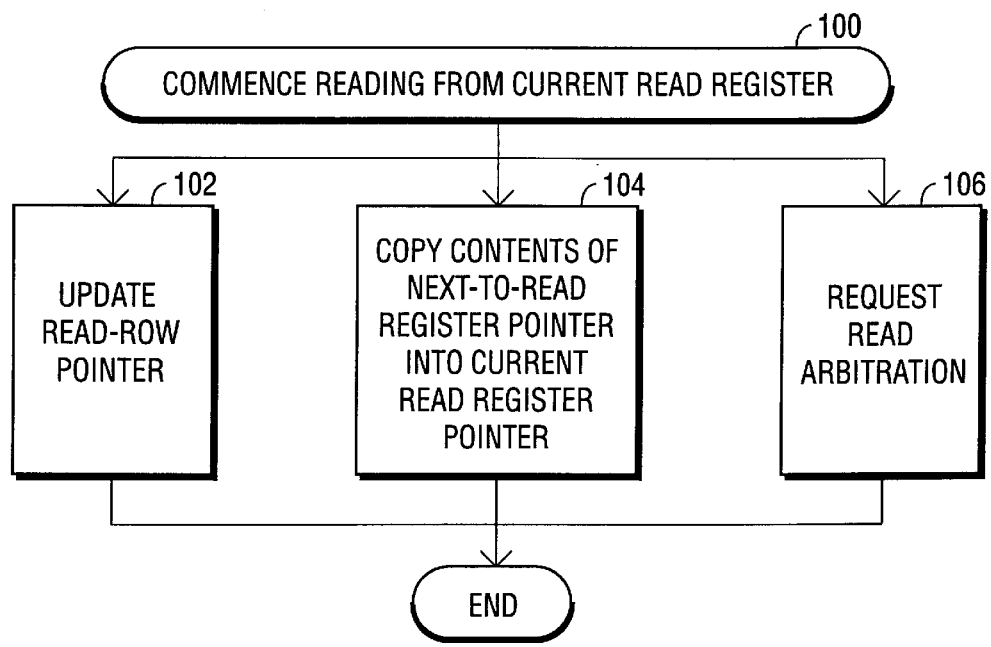
FIG. 6 is a flow diagram illustrating operations performed by the buffer memory device of FIG. 1 when reading tri-port register data from a current read register in a tri-port memory array.
Figure 7:
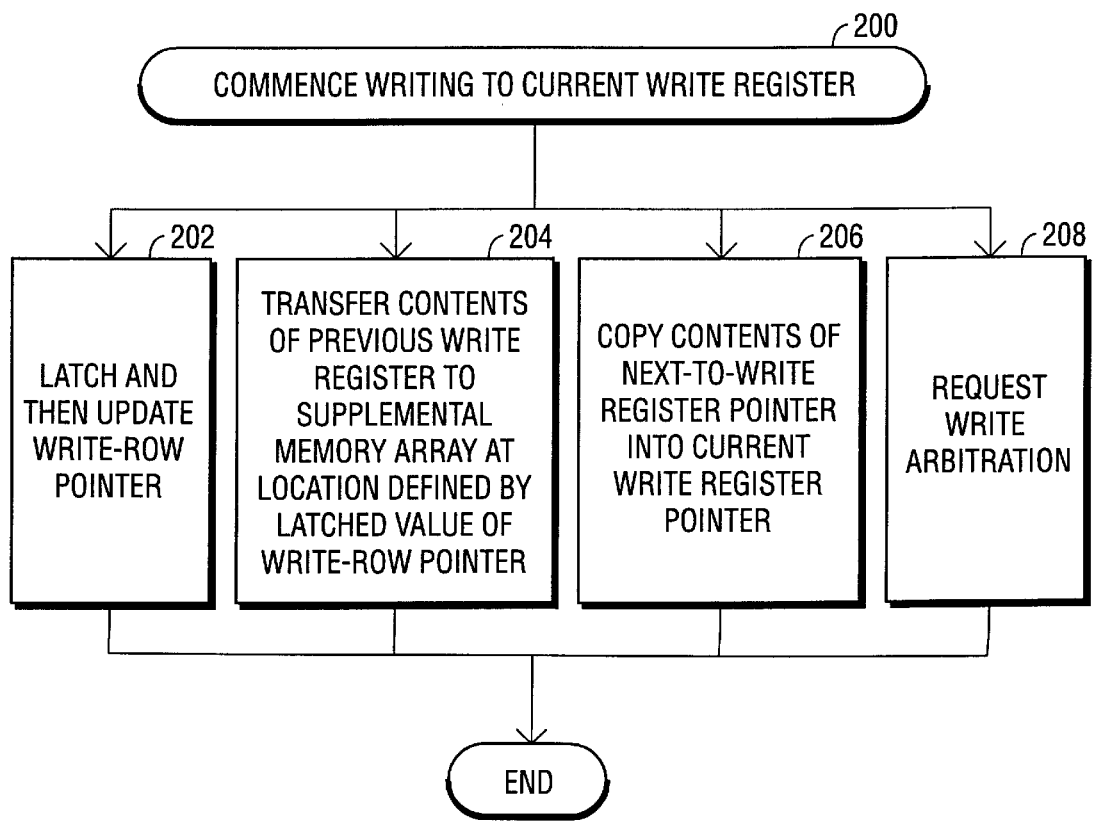
FIG. 7 is a flow diagram illustrating operations performed by the buffer memory device of FIG. 1 when writing data into a current tri-port register in a tri-port memory array.

Referring now to FIG. 5, a preferred tri-port SRAM cell contains a unidirectional write port formed by complementary data input lines (WB and WBB) and enabled by a write word line (WWL) and a unidirectional read port formed by complementary data output lines (RB and RBB) and enabled by a read word line (RWL). A bidirectional input/output port is also provided by complementary lines IO and IOB and enabled by a transfer signal (XFER). Write data can be transferred from the complementary data input lines to the SRAM cell by applying 3 logic 1 potential to the write word line WWL which is electrically coupled to the gate electrodes of two write pass transistors T1 and T2. Cell data can also be read on complementary data lines by applying a logic 1 potential to the read word line RWL which is electrically coupled to the gate electrodes of two read pass transistors T3 and T4. The reading operation can be performed without affecting cell voltage levels by eliminating a direct electrical connection between lines RB and RBB and internal nodes DATAB and DATA, respectively. In particular, the values of the voltages at internal nodes DATAB and DATA can be determined by sensing the "on" or "off" condition of pull down transistors PD1 and PD2 once a logic 1 potential is applied to the read word line RWL. The internally stored data can also be provided to the bidirectional input/output port (lines IO and IOB) by driving the transfer signal (XFER) to a logic 1 potential to turn on pass transistors T5 and T6. Here, lines IO and IOB are initially equilibrated to a high voltage, preferably Vdd. Then, either line IOB or line IO is brought to a somewhat lower potential through T5 or T6 depending on whether DATAB or DATA is at a logic 0 potential. The difference in potential between line IO and IOB is then sensed by a sense amplifier, such as the sense amplifier 22 in FIG. 1. To write data into the tri-port SRAM cell, lines IO and IOB at the bidirectional input/output port at set to complementary logic values and then the transfer signal XFER is set to a logic 1 potential to turn on pass transistors T5 and T6.

Referring now to FIGS. 6–10, preferred methods of controlling memory buffers during normal and test mode operation will be described. As described above with reference to FIGS. 1–5, the tri-port memory array 20 acts as a cache memory array containing a plurality of registers of multi-port memory cells and the RAM memory array 30 (e.g., DRAM) acts as a supplemental memory array of much greater capacity. In particular, to enable the buffer memory device 10 to have the most preferred features of current state-of-the-art dual-port sequential buffer memory devices (e.g., FIFO, LIFO), preferred methods of operating the sequential memory device include the steps of reading data from a current tri-port register (e.g., register A) in the cache memory array to a peripheral device, writing data from a peripheral device to a current write register (e.g., register B) and also performing read and write arbitration to always make a next-to-write register (e.g., register C) and a next-to-read register (e.g., register D) available in the cache memory array.

Figure 9:
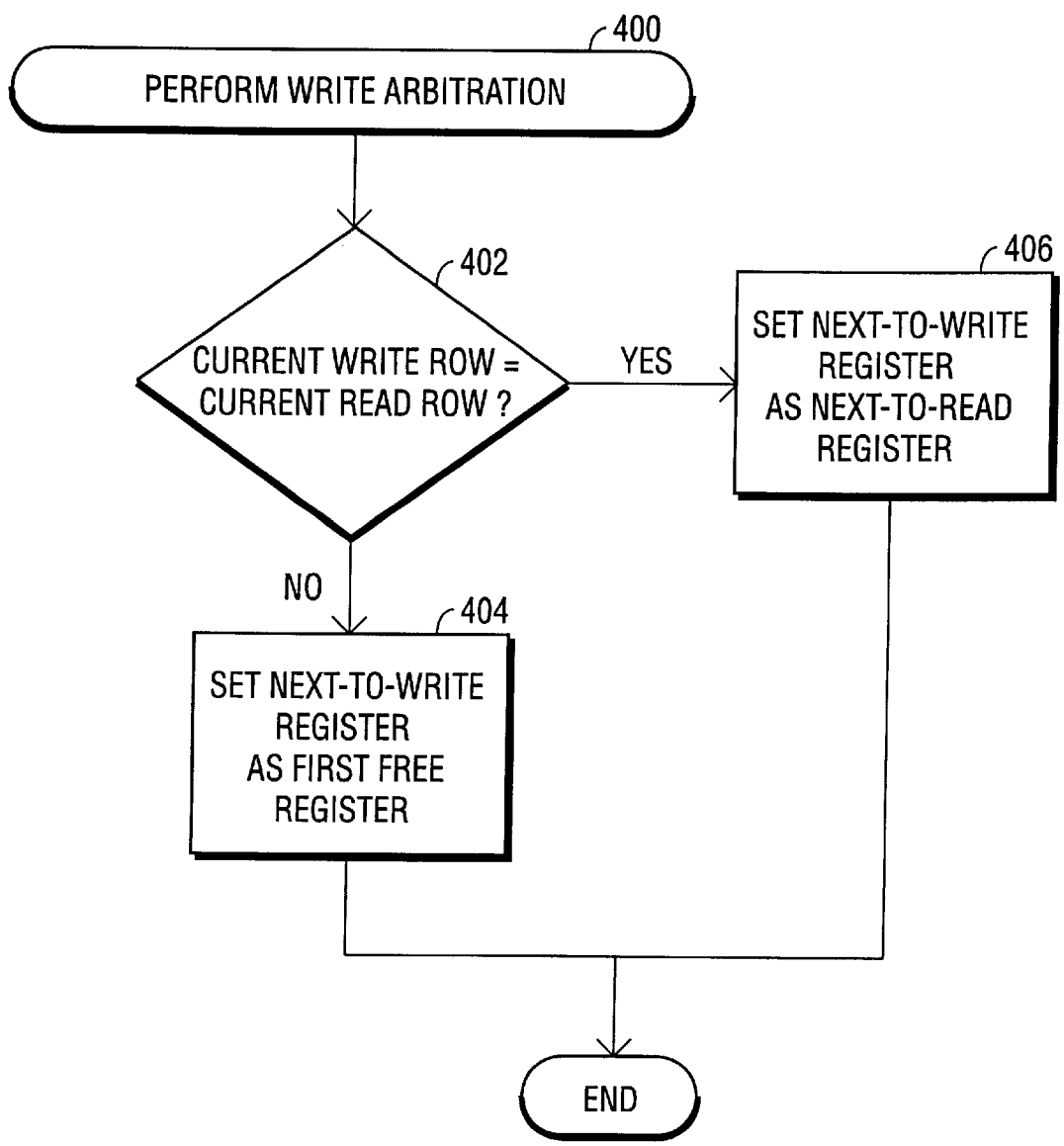
FIG. 9 is a flow diagram illustrating write arbitration operations performed by the buffer memory device of FIG. 1.
Figure 10:
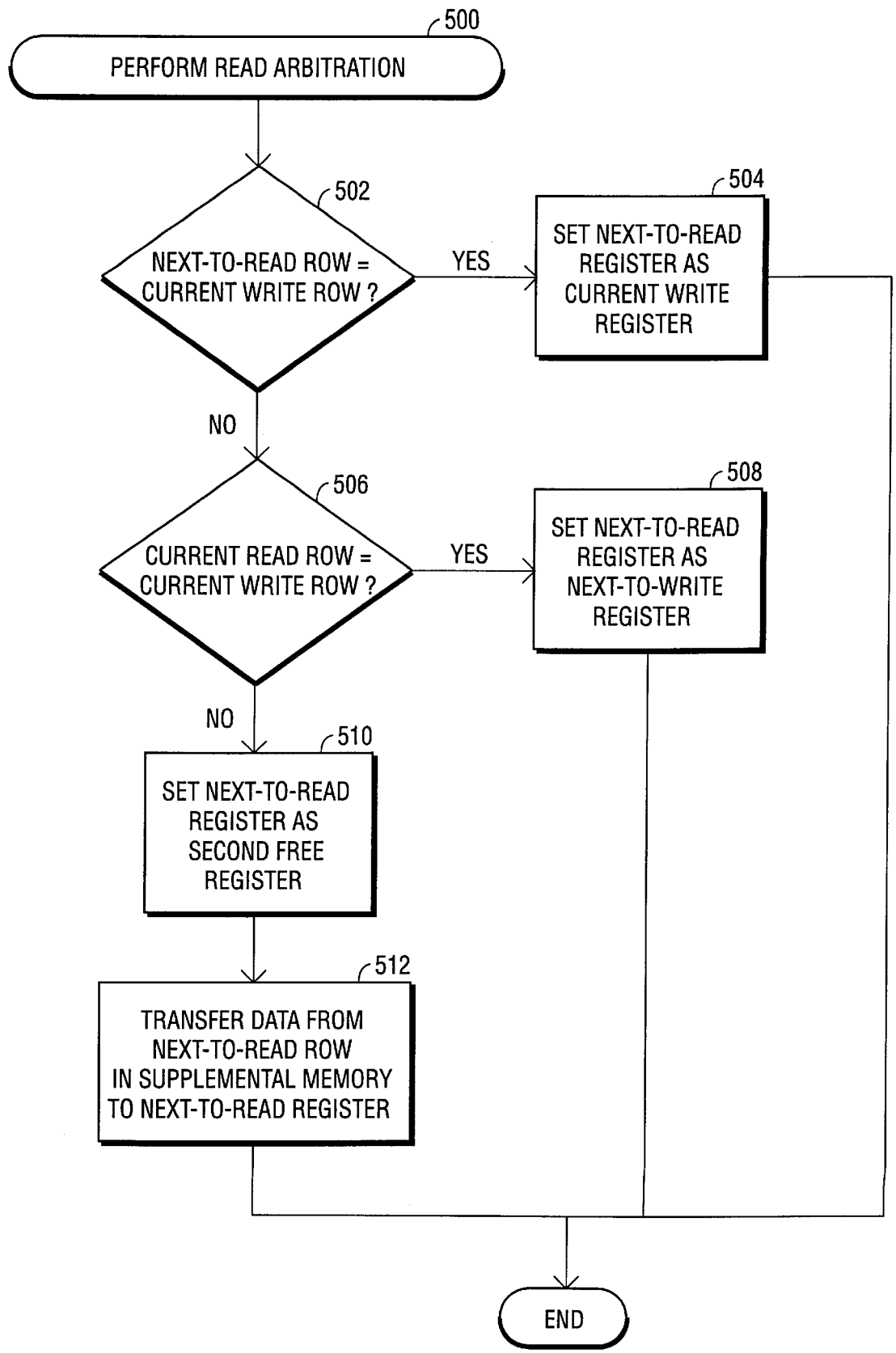
FIG. 10 is a flow diagram illustrating read arbitration operations performed by the buffer memory device of FIG. 1.

As best illustrated by FIG. 9, the operations 400 for performing write arbitration include determining a next-to-write register as a first free register in the cache memory array if the current read and write registers are different registers, Blocks 402 and 404, or as the next-to-read register if the current read and write registers are the same register, Blocks 402 and 406. Here, the operations for determining whether the current read and write registers are the same or different at Block 402 are preferably performed by comparing whether the values of the current read register pointer 17a and current write register pointer 19a of FIG. 1 are the same. Alternatively, the values of the read row and write row pointers 25 and 23, respectively, may be compared to determine whether the current read and write registers are the same or different. For example, the read row pointer 25 may be preferably configured to provide a first pointer to the row in supplemental memory 30 containing data in the current read register and a second pointer to the row containing next-to-read data relative to the data in the current read register. Thus, a direct comparison of equivalency between the value of the first pointer and the value of the write row pointer could be made. However, because a comparison of the read and Trite row pointers may be more computationally complex (e.g., requiring an 11-bit comparison) than a comparison of the values of the current read and current write register pointers (e.g., requiring a 2 or 4-bit comparison), a comparison of the current read and write register pointers is preferred. As illustrated best by FIG. 10, the operations 500 for performing read arbitration include determining a next-to-read register as the current write register if the current write register contains next-to-read data relative to data in the current read register, Blocks 502 and 504. Read arbitration operations also include determining the next-to-read register as a second free register in the cache memory array 20 if the current read and write registers are different registers and the next-to-read register is not the current write register, Blocks 502, 506 and 510, or as the next-to-write register if the current read and write registers are the same register, Blocks 502, 506 and 508. According to a preferred aspect of the read arbitration operations 500, the operations for determining the next-to-read register as the second free register are closely followed by the step of transferring next-to-read data relative to the data in the current read register from the supplemental memory array 30 to the second free register, Blocks 502, 506, 510 and 512, via the steering circuitry of FIG. 1. As with the write arbitration operations 400, the operations for determining whether the next-to-read register and the current write register are the same or different at Block 502 may be performed by comparing the values of the read row pointer 25 and write row pointer 23 to determine if they point to the same row in the supplemental memory 30. However, the operation for determining whether the current read register and current write register are the same or different at Block 506, is preferably similar to the operation described with respect to Block 402 of FIG. 9. In other words, a comparison of the current read register pointer 17a and current write register pointer 19a may be performed. Here, the operations for performing read arbitration are preferably preceded by an operation to update the read row pointer 25, as described more fully hereinbelow with respect to FIG. 6., so that an updated value of the read row pointer/counter 25 can be used for comparison with the write row pointer/counter 23. For example, an operation can be performed during read arbitration to compare the value of the read row pointer 25 (which preferably points to a row in the supplemental memory containing next-to-read data relative to the data in the current read register) with the value of the write row pointer 23, and then assign one of the four registers in the cache memory array as the next-to-read register based on the outcome of the comparison. This assigned next-to-read register then receives next-to-read data relative to the data in the current read register, as illustrated by Block 512 in FIG. 10. Here, the write row pointer 23 is preferably controlled to point to a current write row in the supplemental memory array 30 which is to receive data from the current write register once the current write register has been filled. Then, during performance of the read arbitration operation 500, the next-to-read register is determined as the current write register if the read row pointer 25 points to the current write row when the step of comparing the values of the pointers is performed, Blocks 502 and 504. The next-to-read register is also determined as the next-to-write register at Blocks 506 and 508 if the current read row is the same as the current write row because the current read register pointer 17a and the current write register pointer 19a contain the same value. Alternatively, although less preferred, the read row pointer 25 may also provide a pointer to the current read row (which is typically one row below the next-to-read row in the supplemental memory array 30) and this pointer may be directly compared (e.g., as an 11-bit operand) with the value of the write row pointer 23.

Referring again to FIG. 6, preferred operations 100 are also performed upon commencement of the steps of reading data from a current read register. These operations 100 include the operation of updating the read row pointer 25 to point to a row of data in the supplemental memory 30 which contains next-to-read data relative to the data in the current read register, Block 102, and the operation of copying the contents of the next-to-read register pointer 17b into the current read register pointer 17a, Block 104, so that the register now being read from is properly defined for performance of read arbitration. At about the time the operations of Blocks 102 and 104 are performed, or shortly thereafter, a request for read arbitration, Block 106, is generated. Similarly, referring now to FIG. 7, preferred operations 200 are also performed upon commencement of the steps of writing data to a current write register. These operations include the operations of latching and then updating the value of the current write row pointer/counter 23, Block 202, and transferring the contents of the tri-port register previously written to, to a row in the supplemental memory array 30 which is defined by the latched value of the write row pointer/counter 23, Block 204. Similar to the operation illustrated by Block 104 of FIG. 6, an operation is also performed to copy the contents of the next-to-write register pointer 19b into the current write register pointer 19a, Block 206, so that the register currently being written to is properly defined for write arbitration. At about the time the operations of Blocks 202, 204 and 206 are performed, or shortly thereafter, a request for write arbitration, Block 208, is generated. The operations illustrated by FIGS. 6–7, however, need not be initially performed after a master reset operation.

Figure 8:
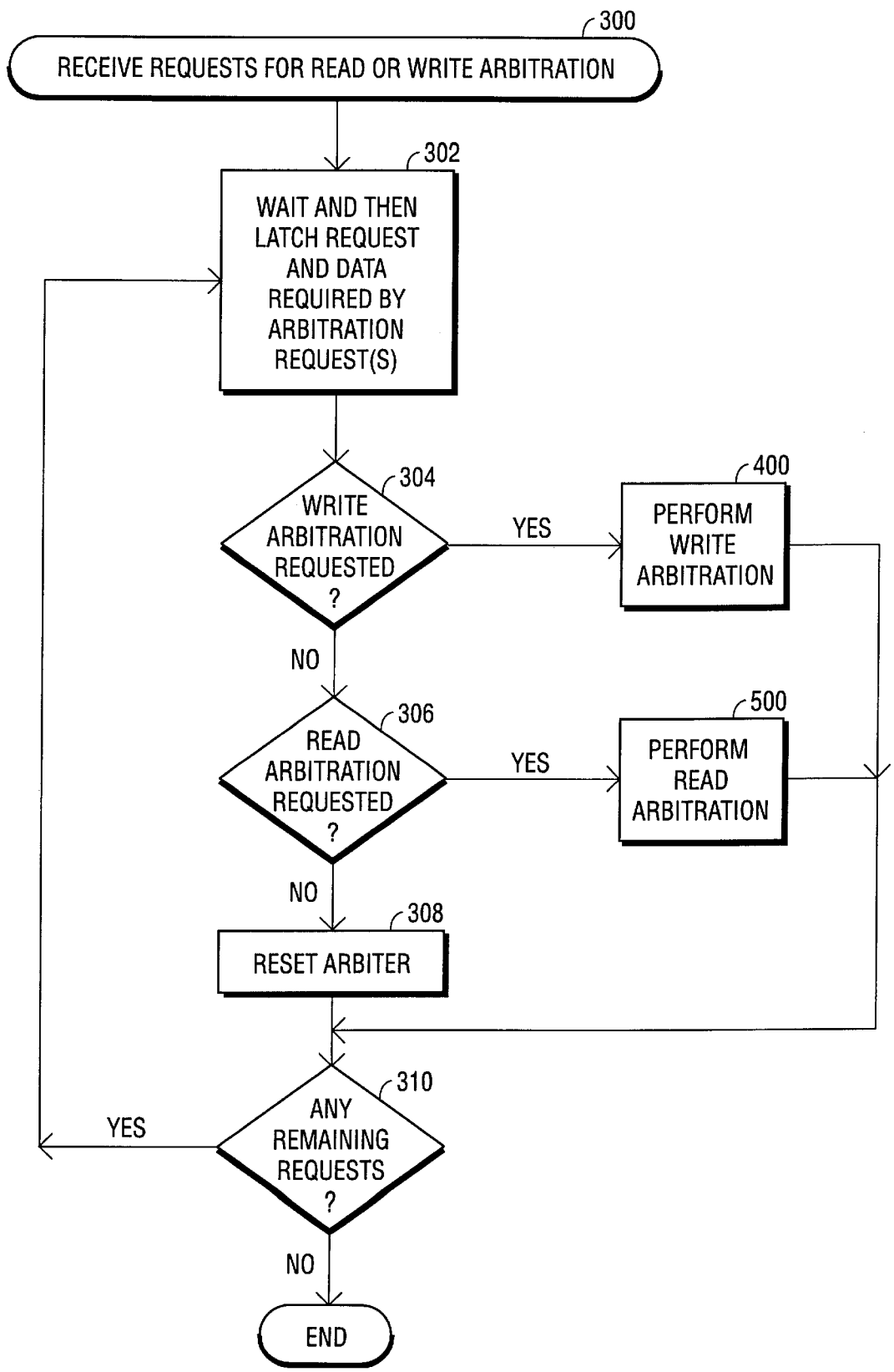
FIG. 8 is a flow diagram illustrating operations performed by the buffer memory device of FIG. 1 upon receipt of read and/or write arbitration requests.

Referring now to FIG. 8, additional operations 300 performed under control of the processor and tri-port control logic 15 upon receipt of a read and/or write arbitration request, are illustrated. Here, an initial operation is performed to latch the requests and latch data that will be required upon performance of the read and write arbitration operations, Block 302. Checks are then made at Blocks 304 and 306 to determine whether a read or write arbitration request has been made, and then initiate performance of the arbitration at Blocks 400 and 500. The arbiter is also reset after performance of the requested arbitrations, Block 308. As illustrated by Block 310, multiple read and write arbitration requests may also be handled.

These above-described arbitration operations may cause seemingly random assignments of registers as read or write registers depending on, among other things, the number of write versus read operations and the phases of the asynchronous read and write clocks. Thus, as determined by the inventors herein, it may be difficult to know, a priori (and even after the fact), the sequence of registers and related devices which received test data during test mode read and write operations. It may also be difficult to assess the operation of the control logic and/or isolate certain registers as read and write registers so that operation of these registers can be selectively and individually tested. In particular, the asynchronous and independent operation of the read and write clocks can make the arbitration operations performed by the processor and control logic 15 appear undeterministic. This is because the selection of read and write registers does riot follow a predetermined sequence during write-to-register and read-from-register time intervals or during operations to transfer data from the embedded supplemental memory array 30 to a selected register in the tri-port memory array 20. In other words, emulation of a tri-port memory array 20 and embedded supplemental memory array 30 as a dual-port FIFO device 10, as described above, can complicate operations to perform complete testing prior to shipment of the memory device 10 to an end user.

To address these and other difficulties associated with test mode operation, the present invention provides preferred methods of testing buffer memory devices and other integrated circuit devices which can provide path identification information as binary coded information even when seemingly random and arbitrary assignments of internal data traversal paths (and devices in those paths) are selected. These methods provide useful means for debugging, among other things, the arbitration operations performed by the processor and control logic 15 when selecting read and write registers. As will be understood by those skilled in the art, these methods of the present invention may also be useful when investigating data dependencies on individual registers.

The preferred test methods include the steps of transferring test data into the buffer memory device 10 and then controlling operation of the device via the processor and control logic 15 so that the test data traverses a first path through the memory device 10. A step is then performed to retrieve at least a portion of the test data and an identification of at least a first portion of the first path from the memory device 10. This path identification information, which may be provided as a binary code, can then be used to interpret the test data and verify operation of the memory device 10, the tri-port memory array 20, the supplemental memory array 30 and the processor and control logic 15, for example. The step to retrieve at least a portion of the test data and an identification of at least a portion of the first path may be preceded by the step of overwriting a first portion of the test data with an identification of a first portion of the first path. Thus, an identification (e.g., address code) of the current write register (receiving test data) may be "tagged" to a series of test words written into the current write register during test mode operation. Similarly, when the test data is ultimately read from the memory device 10, an identification of the current read register may be "tagged" to the series of test words read from the current read register. According to preferred aspects of this reading step, the tagged identification may be interleaved into the stream of test data being read from the current read register, may be overwritten into the stream or may be separately stored in the device (e.g., in a register(s) within the processor and control logic 15) and then provided (along with other path identification and status information) as a serial or parallel stream of identification data from the output register 14 or other input/output port(s).

For example, if the processor and control logic 15 has defined register A of the tri-port memory array 20 as the current write register to receive test data during a first write-to-register time interval, a column (or multiple columns) of tri-port memory cells in register A, may be reserved for the register A address. This address may be provided by the processor and control logic 15. Then, once register A has been filled with test data, the data contained therein (including the register A address) may be transferred to a first row of memory in the embedded supplemental memory array 30 during a write-to-memory time interval. Similarly, register B is defined by the arbitration control logic 15 as the next-to-write register during the first write-to-register time interval, then an identification of register B may be stored in register B once test data is written to register B. Similarly, once register B has been filled with test data, this test data along with the identification of register B can be transferred to a second row of memory in the supplemental memory array 30.

The test and identification data in the first and second rows of the supplemental memory array 30 may then be downloaded into current and next-to-read registers (e.g., registers C and D), respectively, during respective read-from-memory time intervals. This identification data may also contain identifications (e.g., addresses) of the first and second rows in the supplemental memory array 30. During these transfer steps, respective identifications of the registers receiving the test data from the supplemental memory array 30 may also be written into one or more columns of cells in the registers. The test data and identification data in the current and next-to-read registers may then be read from the tri-port memory array 20 during consecutive read-from-register time intervals. During these reading steps, data identifying registers C and D as the read registers (for their respective test data) may be interleaved into the data stream being read from the tri-port memory array 20 (by the processor and control logic 15), may be overwritten into the data stream or may be separately accessed from another input/output port(s) of the memory device 10. This write and read register identification information can then be extracted from the test data and used to interpret performance of the registers in the tri-port memory array 20 and arbitration control circuitry (including the processor and control logic 15) during test mode operation.

The methods of the present invention may also include steps of recording status information (e.g., the state of the embedded supplemental memory 30, the address of the row(s) of the supplemental memory receiving test data, counter and pointer values, flag status, etc.) and other device identification information pertinent to the test data being written to and/or read from the device 10 under test. This information may be overwritten into the test data, may be interleaved into the test data during reading or may be separately stored in a register(s) in the processor and control logic 15 for immediate access during testing or subsequent access via the output register 14 or other input/output pads (not shown). Accordingly, the present invention provides improved methods of diagnosing the operation of an integrated circuit under test by providing data traversal path information and related information as a "window" into the operation of a device containing difficult to test devices, such as embedded memory and undeterministic control circuitry, for example.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of testing a buffer memory device containing a multi-register cache memory array and a supplemental memory array therein, said method comprising the steps of:
    writing first data to at least one of a plurality of addresses within a first register in the cache memory array;
    transferring the first data and an identification of the first register that is independent of the plurality of addresses to the supplemental memory array; and
    reading the first data and the identification of the first register from the memory device.

2. The method of claim 1, wherein said step of transferring the first data to the supplemental memory array is preceded by the step of writing the identification of the first register into the first register; and wherein said step of transferring the first data to the supplemental memory array comprises transferring the first data and the identification of the first register from the first register to the supplemental memory array.

3. The method of claim 1, wherein said step of transferring the first data to the supplemental memory array comprises transferring the first data and the identification of the first register to a row of memory cells in the supplemental memory array.

4. The method of claim 3, wherein said reading step is preceded by the step of transferring the first data and the identification of the first register from the supplemental memory array to a second register in the cache memory array.

5. The method of claim 4, wherein said reading step comprises reading the first data and the identification of the first register from the second register.

6. A method of testing a buffer memory device containing a multi-register cache memory array and a supplemental memory array therein, said method comprising the steps of:
    writing first data to at least one of a plurality of first addresses within a first register in the cache memory array;
    transferring the first data to at least one of a plurality of second addresses within a second register in the cache memory array;
    reading the first data from the second register in the cache memory array; and
    reading identifications of the first and second registers that are independent of the plurality of first and second addresses from the memory device.

7. The method of claim 6, wherein said writing step is followed by the step of transferring the first data and the identification of the first register to the supplemental memory array; and wherein said transferring step comprises transferring the first data and the identification of the first register from the supplemental memory array to the second register.

8. The method of claim 6, wherein said writing step is followed by the step of transferring the first data and the identification of the first register to a first row in the supplemental memory array; and wherein said transferring step comprises transferring the first data, the identification of the first register and an identification of the first row into the second register.

9. The method of claim 8, wherein said reading step comprises reading the identification of the first row from the second register.

10. The method of claim 9, wherein said reading step comprises reading the identification of the first row and the identification of the second register from the second register.

11. A method of testing a buffer memory device containing a multi-register cache memory array and a supplemental memory array therein, said method comprising the steps of:
    writing first test data to a first register in the cache memory array;
    transferring the first test data from the first register to the supplemental memory array;
    transferring an identification of the first register to the supplemental memory array;
    transferring the first test data from the supplemental memory array to a second register in the cache memory array;
    reading the first test data from the second register; and
    reading an identification of the first register and an identification of the second register from the buffer memory device.

12. The method of claim 11, wherein said step of transferring the first data from the supplemental memory array to a second register comprises transferring the identification of the first register from the supplemental memory array to the second register.

13. The method of claim 12, wherein said step of writing first test data to a first register comprises writing first test data and an identification of the first register to the first register.

14. A method of testing a buffer memory device containing a multi-register cache memory array and a supplemental memory array therein, said method comprising the steps of:
    writing first test data to a first register in the cache memory array;
    transferring the first test data from the first register to the supplemental memory array;
    transferring the first test data from the supplemental memory array to a second register in the cache memory array;
    reading the first test data from the second register; and
    reading an identification of the first register and an identification of the second register from the buffer memory device;
    wherein said step of writing first test data to a first register comprises writing first test data and an identification of the first register to the first register.

15. The method of claim 14, wherein said step of transferring the first test data from the first register to the supplemental memory array comprises transferring the first test data and the identification of the first register from the first register to a row of memory cells in the supplemental memory array.

16. The method of claim 15, wherein said step of transferring the first test data from the supplemental memory array to a second register comprises transferring the first test data and the identification of the first register from the row of memory cells in the supplemental memory array to the second register.

17. The method of claim 16, wherein said reading steps comprise reading test data and the identification of the first register from the second register.

18. The method of claim 16, wherein said reading steps comprise reading the first test data, the identification of the first register and an identification of the second register from the second register.

19. A method of testing a memory device containing a plurality of multi-port registers and control logic that performs arbitration to determine which registers comprise multi-port write registers and which registers comprise multi-port read registers, said method comprising the steps of:
  arbitrating to determine a write register;
  writing first data to the write register;
  arbitrating to determine a read register;
  transferring the first data to the read register;
  reading the first data from the read register; and
  reading an identification of the write register from the memory device.

20. The method of claim 19, wherein said step of reading an identification comprises reading an identification of the write register and an identification of the read register from the memory device.

21. The method of claim 20, wherein said transferring step comprises transferring the first data and an identification of the write register to the read register; and wherein said step of reading an identification comprises reading an identification of the write register from the read register.

22. The method of claim 21, wherein the memory device contains a supplemental memory array; and wherein said step of reading the first data is preceded by the steps of:
  transferring the first data from the write register to the supplemental memory array; and
  transferring the first data from the supplemental memory array to the read register.

23. The method of claim 21, wherein said step of transferring the first data to the supplemental memory array comprises transferring the first data and an identification of the write register to the supplemental memory array.

24. The method of claim 19, wherein said step of writing first data to the write register comprises writing first data and an address of the write register into the write register.

25. The method of claim 24, wherein the memory device comprises a supplemental DRAM array; and wherein said step of reading the first data from the read register is preceded by the step of transferring the first data and the address of the write register into the supplemental DRAM array.

26. A method of testing an integrated circuit, comprising the steps of:
  transferring first data into an integrated circuit containing devices therein;
  controlling operation of the integrated circuit so that the first data traverses a first path through the devices therein; and then retrieving at least a portion of the first data and an identification of a first portion of the first path from the integrated circuit.

27. The method of claim 26, wherein said retrieving step is preceded by the step of overwriting a first portion of the first data with an identification of a first portion of the first path.

28. The method of claim 27, wherein said retrieving step comprises retrieving a second portion of the first data as a data stream while simultaneously interleaving an identification of a second portion of the first path into the data stream.

29. The method of claim 26, wherein said retrieving step comprises retrieving a portion of the first data as a data stream while simultaneously interleaving an identification of a second portion of the first path into the data stream.

30. The method of claim 26, wherein said transferring step comprises transferring first data into a first device in the integrated circuit; and wherein said retrieving step comprises retrieving at least a portion of the first data and an identification of the first device, from the integrated circuit.

31. The method of claim 30, wherein said retrieving step is preceded by the step of transferring an identification of the first device into a second device in the integrated circuit; and wherein said retrieving step comprises retrieving the identification of the first device from the second device.

32. The method of claim 31, wherein the first and second devices comprise registers.

33. The method of claim 26, wherein said controlling step comprises controlling operation of the integrated circuit so that the first data traverses a first path through the devices therein during a first time interval; and wherein said retrieving step comprises retrieving information relating to a status of a device in the integrated circuit during the first time interval, from the integrated circuit.

34. The method of claim 33, wherein said retrieving step comprises retrieving information relating to a status of a device in the first path, from the integrated circuit.

35. The method of claim 26, wherein said controlling step comprises controlling operation of the integrated circuit as a first-in first-out buffer memory device so that the first data traverses a first path through the devices in the memory device during a first time interval; and wherein said retrieving step comprises retrieving information relating to a status of a device in the memory device during the first time interval, from the integrated circuit.

36. A method of testing a first-in first-out buffer memory device that is responsive to asynchronous read and write clock signals, comprising the steps of:
  writing first data into a first multi-port register in-sync with the write clock signal;
  writing second data into a second multi-port register in-sync with the write clock signal;
  transferring the first data from the first multi-port register into a supplemental memory array within the buffer memory device; then
  transferring the first data from the supplemental memory array into the second multi-port register;
  reading the first data from the second multi-port register in-sync with the read clock signal; and
  reading an identification of the first multi-port register from the memory device.

37. The method of claim 36, wherein said step of transferring the first data from the first multi-port register into a supplemental memory array comprises writing at least a first portion of the first data and the identification of the first multi-port register into the supplemental memory array.

38. The method of claim 37, wherein said step of transferring the first data from the supplemental memory array to the second multi-port register comprises overwriting at least a portion of the second data in the second multi-port register by transferring the identification of the first multi-port register from the supplemental memory array into the second multi-port register.

39. The method of claim 38, wherein said step of reading the first data from the second multi-port register comprises reading the identification of the first multi-port register from the second multi-port register in-sync with the read clock signal.

40. The method of claim 39, further comprising the step of writing an identification of the second multi-port register into the second multi-port register.

41. The method of claim 40, wherein said step of reading the first data comprises reading the first portion of the first data, the identification of the first multi-port register and the identification of the second multi-port register from the second multi-port register.

42. A method of testing a memory device having an embedded memory array therein, comprising the steps of:

writing test data and an address of a first register into least one of a plurality of first addresses within the first register;

transferring the test data and the address of the first register to the embedded memory array;

writing test data, the address of the first register and an address of a second register into at least one of a plurality of second addresses within the second register; and reading the test data and the addresses of the first and second registers from the second register.

43. The method of claim 42, wherein the addresses of the first and second registers are generated internally by the memory device.

* * * * *